United States Patent [19]
Barraza et al.

[11] Patent Number: 5,379,184
[45] Date of Patent: Jan. 3, 1995

[54] PRY-IN/PRY-OUT DISK DRIVE RECEPTACLE

[75] Inventors: Steven Barraza, Santa Clara; Mark Feldmeyer, San Jose; William Black, San Jose; Thomas Hassur, San Jose, all of Calif.

[73] Assignee: Unisys Corporation, Blue Bell, Pa.

[21] Appl. No.: 141,461

[22] Filed: Oct. 25, 1993

Related U.S. Application Data

[63] Continuation of Ser. No. 753,276, Aug. 30, 1991, abandoned.

[51] Int. Cl.⁶ ............... H05K 7/10; H01A 13/629; A47B 95/02
[52] U.S. Cl. .................. 361/685; 361/726; 361/727; 16/112; 16/126; 439/157; 439/483; 312/332.1; 312/333
[58] Field of Search .............. 211/41; 16/112, 126; 439/152, 155, 157, 159, 160, 483, 484; 312/223.2, 332.1, 333; 200/50 AA, 61.61; 361/606–609, 680–687, 724–727, 730–732, 754, 759, 798, 801; 384/708.1; 360/97.01, 98.01, 137

[56] References Cited

U.S. PATENT DOCUMENTS

| | | | |
|---|---|---|---|
| 2,514,246 | 7/1950 | Knox | 312/332.1 X |
| 3,953,094 | 4/1976 | Brown, Jr. | 312/332.1 X |
| 4,214,172 | 7/1980 | See | 361/339 X |
| 4,603,239 | 7/1986 | Ishii | 200/61.61 |
| 4,811,579 | 3/1989 | Lyons et al. | 312/333 X |
| 4,980,800 | 12/1990 | Furuta | 361/391 |
| 5,010,426 | 4/1991 | Krenz | 439/157 X |
| 5,077,722 | 12/1991 | Geist et al. | 360/137 X |
| 5,122,914 | 6/1992 | Hanson | 360/98.01 |
| 5,126,890 | 6/1992 | Wade et al. | 360/98.01 X |

*Primary Examiner*—Michael W. Phillips
*Attorney, Agent, or Firm*—John J. McCormack; Mark T. Starr

[57] ABSTRACT

Described is a multi-module storage array including cabinets, each with a number of identical bays for receiving any of a set of replaceable, modular push-in/pull-out articles, each to be inserted into any bay, each including a carry-handle having an outer bar joining a pair of arms pivoted from opposite sides of the article so that the arm ends can be swung against a first stop to pry-in the article (into its bay) and can also be swung oppositely against a second stop to pry it out, with the handle also adapted to be automatically "kicked-out" horizontal (to indicate readiness for removal) and being held horizontal unit reset.

39 Claims, 31 Drawing Sheets

| STATE | STATUS LED | MODULE LED | MODULE STATUS |
|---|---|---|---|
| EMPTY | SOLID GREEN | OFF | DISABLED.DISCONNECTED.AND UNLOCKED |
| WAIT INSERT | BLINK AMBER | BLINK AMBER | DISABLED.DISCONNECTED.AND UNLOCKED |
| STANDBY | SOLID GREEN | SOLID AMBER | DISABLED.CONNECTED.AND LOCKED |
| ONLINE | SOLID GREEN | SOLID GREEN | DISABLED.CONNECTED.AND LOCKED |
| WAIT REMOVE | BLINK AMBER | BLINK AMBER | DISABLED.CONNECTED.AND UNLOCKED |
| ILLEGAL | SOLID AMBER | SOLID AMBER | DISABLED.CONNECTED.AND LOCKED |

FIG. 10

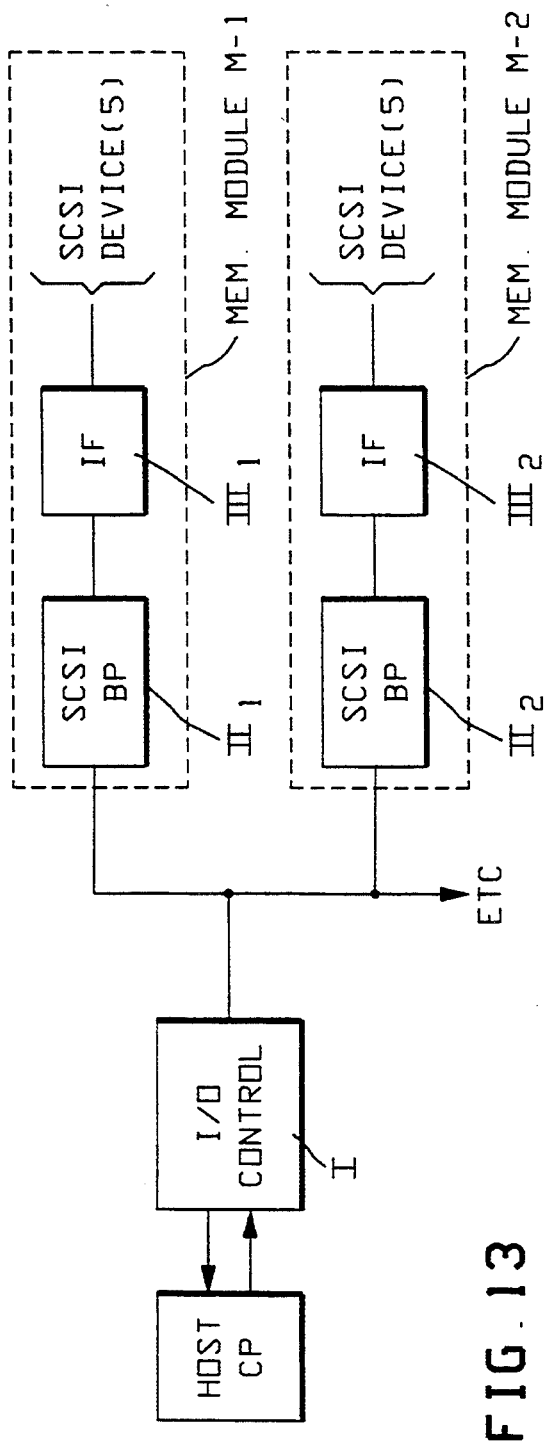

FIG. 13

FIG. 13-A
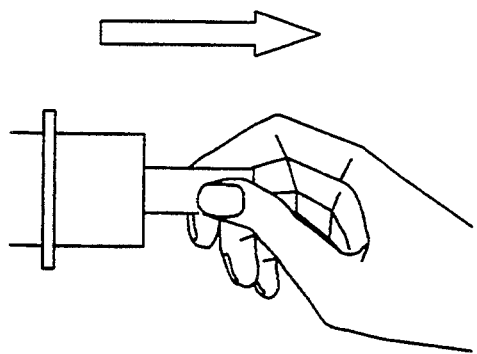
FIG. 13-B
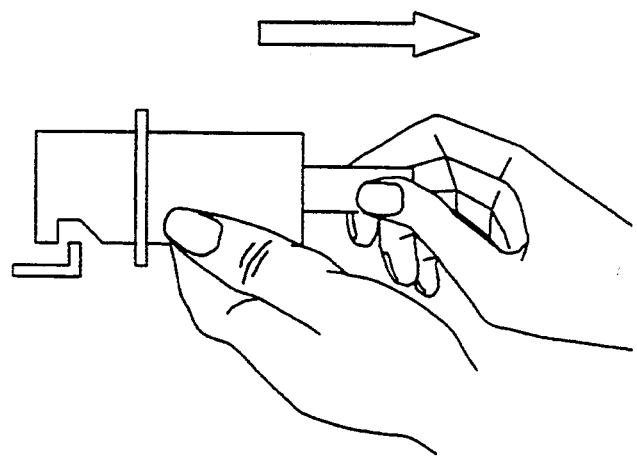
FIG. 13-C
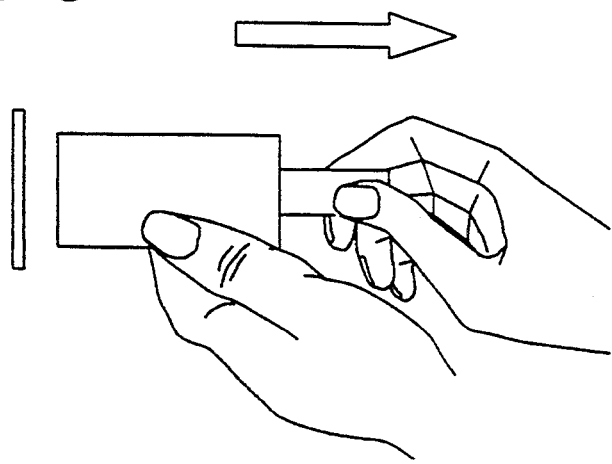

PRY-IN/PRY-OUT DISK DRIVE RECEPTACLE

This application is a continuation of patent application Ser. No. 07/753,276, filed Aug. 30, 1991, now abandoned.

RELATED CASES

Related subject matter is found in commonly-assigned U.S. Ser. No. 08/099,811 filed on Jul. 28, 1993 and its parent U.S. Ser. No. 07/752,160 filed on Aug. 29, 1991, now abandoned, (both having inventors in common herewith).

BACKGROUND, FEATURES

Workers in the storage arts are aware of the need for drawers or like receptacles or other articles that are convenient to insert and remove. Commonly, this requires a degree of manual dexterity and effort; e.g., especially where a number of fastening pins must be firmly seated (or unseated) to properly insert the article. This can present problems for a user that is weak, tired, infirm or in a hurry—sometimes resulting in a poor, shaky drawer placement.

Various auxiliary means giving mechanical advantage for insertion/withdrawal may be visualized; however, this invention involves merely adapting a pre-existing drawer accessory—its handle, e.g., for carrying from place to place—and adapts the carry-handle to be used as an aid: e.g., to pry-in the drawer, and pry it out. The "bay" for receiving such a drawer may also be arranged (or modified) to facilitate such pry-in/pry-out action and may include related switch and latch means.

One aspect of these techniques involves rendering such articles as like modular units, and packaging them as a bank of modular "drawers" in a cabinet, with insertion and removal of the drawers being strictly controlled by associated control means (as is the locking, unlocking thereof), e.g., including switches, with an associated capability. Related to this is an optimized drawer/bay design involving a multi-function "handle" which pries-in, pries-out the drawer, plus associated switches indicating drawer-condition.

SUMMARY OF THE INVENTION

In accordance with this invention, an array of modular, article-receiving storage bays is disclosed, with a number of replaceable, modular push-in/pull-out articles to be inserted into a selected one of the bays; each article including a carry-handle comprising an outer bar joining a pair of arms extending along opposite sides of said article and being pivoted thereon so the inner arm end may be swung transversely; each bay having cooperating stops adapted to engage the arm-ends to facilitate a pry-in/pry-out action to inject/remove the article in its bay.

BRIEF DESCRIPTION OF THE DRAWINGS

The foregoing, and other related, features and advantages are contemplated in the following detailed description of embodiments, wherein:

FIG. 6A is a front perspective of a preferred cabinet housing storage modules (i.e. a storage array) for such a system, while

FIG. 8 is a schematic elevation and partial showing of the front of such a module as loosely placed into a bay and prepared for latch-in with parts cut-away; while

FIG. 10 tabulates various "STATES" (Status) of a module, while the diagram in FIG. 11 functionally interrelates these states;

FIGS. 13A, 13B, 13C schematically illustrate three steps in removing such a module;

While

PREFERRED EMBODIMENTS

Figure 1:
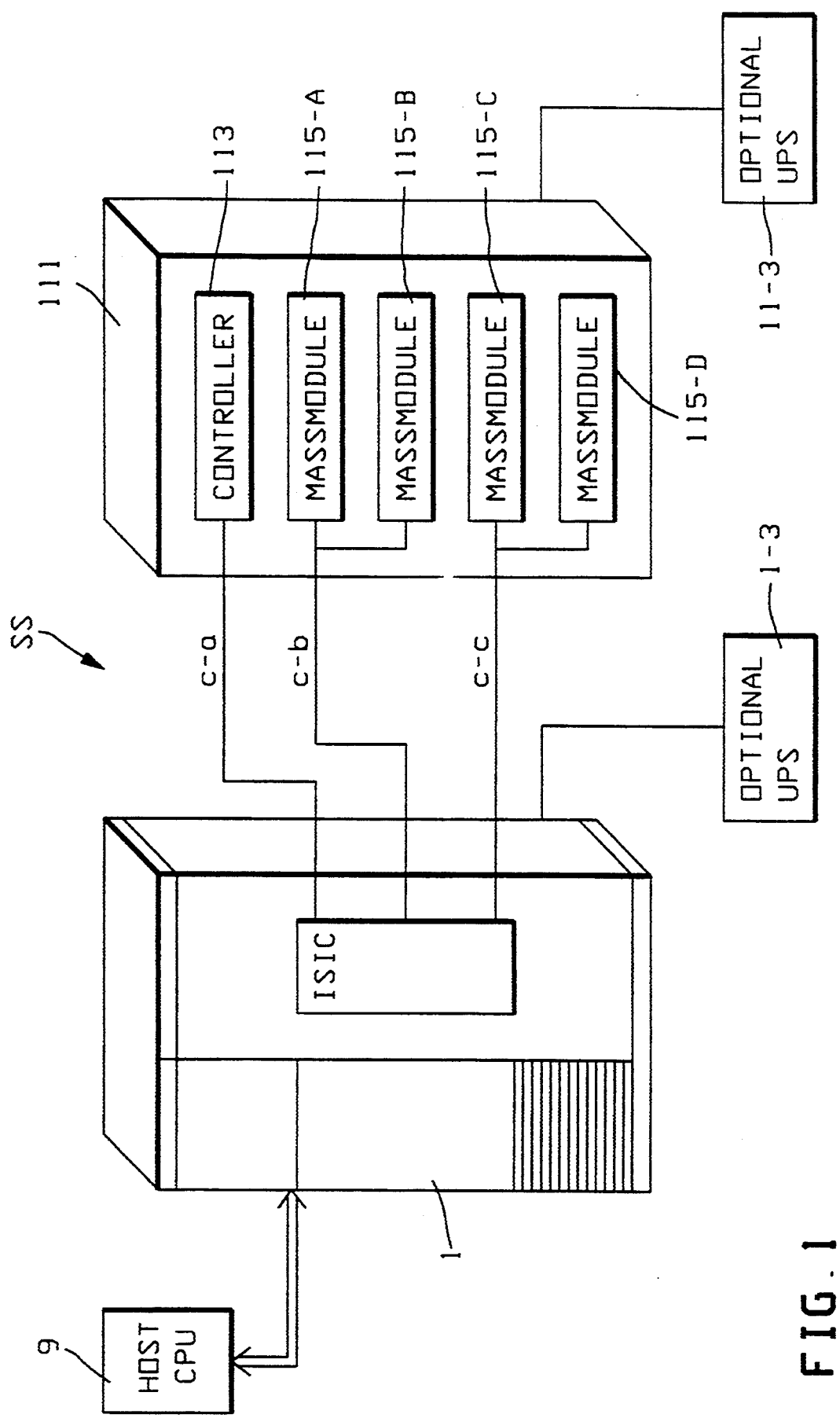
FIG. 1 is a very schematic diagram of a storage system apt for use with the invention; while FIGS. 2–5 each depict a modification of such a system.

FIG. 1 is a very general, simplified block diagram of a computer storage system SS comprising a processor 1 including controller means (preferably with an ISIC, i.e.: integrated SCSI interface controller) arranged and coupled to control (supervise) a single "mass storage unit" 111, comprising four like storage modules 115-A, -B, -C, -D with an associated storage controller 113. The ISIC (Integrated SCSI Interface Controller) Dual SCSI Storage Processor supports a very high rate of I/Os per second, due to features like:

A separate I/O processor (80386 20 Mhz) with 4 Megabytes of RAM,

A "pipelined" architecture, allowing simultaneous transfers from SCSI to Buffer and Buffer to Host, The Disk Storage System II using Differential SCSI only, to support the maximum transfer rates and the longer cable lengths needed to support many disk cabinets, while an EISA bus is used by the ISIC, being designed for high performance, having a burst transfer rate of 32 MB/Sec.

Figure 18:
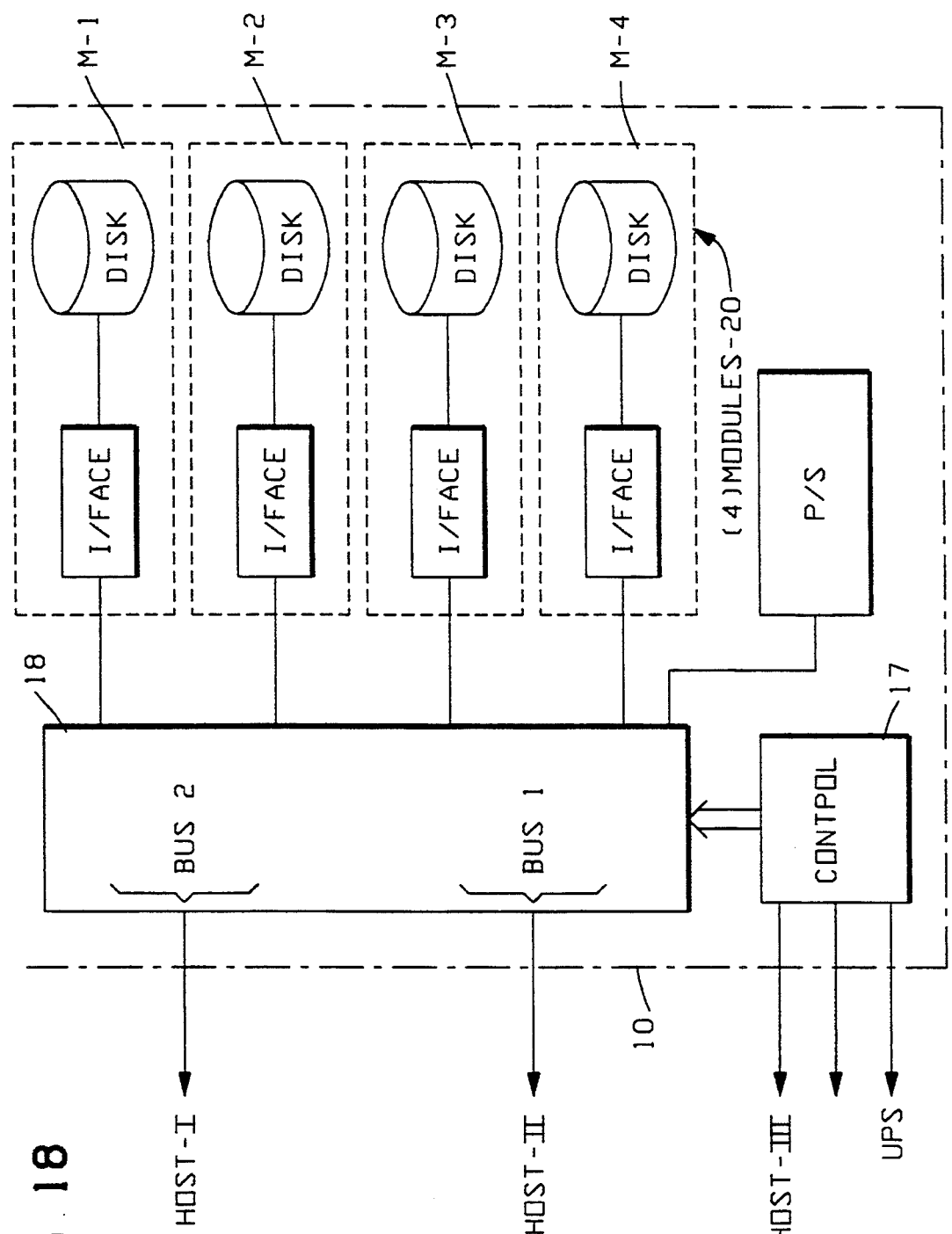
FIG. 18 is a block diagram of a preferred two-bus interface to a number of such modules.

Storage System SS in its most basic configuration has two channels, including both the controller and the Storage Cabinet (see FIG. 18). Processor 1 and/or unit 111 may, optionally, be equipped with an associated uninterruptible power supply (1-3, 11-3 respectively).

As detailed below, processor 1 preferably comprises an ISIC dual SCSI ("small computer system interface", preferably "differential", noise-immune type to run signals faster without degradation), and an I/O storage processor with two SCSI channels per board. Much of its functionality is relegated to its Host CPU 9 (e.g., preferably a multiprocessing server mainframe, handling OPEN/OLTP, serving as an "information hub" for a complex computer network, this mainframe preferably comprising a U6000/65 by Unisys Corp, accommodating one-to-five 33 $MH_z$ Intel 80486 microprocessors), and its ISOC which includes a large memory block (e.g. 4MB, 80386 ISIC-CP) and is capable of simultaneous I/O transfers (disk-to-ISOC, ISIC-to-Host). The dual SCSI I/O processor will be seen to boost the rate of data transfer.

Storage unit 111 is coupled to processor 1 via connector channels c-a, c-b, c-c (preferably an RS-422 cable c-a, and a pair—optionally up to 5—of like SCSI cables, c-b, c-c - which are preferably connected for "dual-channel" operation as in FIG. 18), plus associated software (including Host Manager).

System SS, with associated software (and compatible controlling Host CPU) will be seen to accommodate "on-line" ("hot") removal/replacement/installation of any or all of storage modules 115 (i.e. "HIR" capability) according to a salient feature hereof. Preferably, each module 115 comprises a like removable modular drawer which houses one or several shock-mounted, high-performance (e.g. 1.3 GB) disk drives with high-performance disk-channels (or, alternatively, a comparable tape drive unit). Each drawer provides one or two SCUSI channels; and includes a carry handle means and associated locking mechanism, the handle also serving as insert/extract lever and lock-engager, as detailed below.

Each disk drive (or tape drive) thus is "packaged" and shock-mounted in a drawer, with no need to install mounting hardware or connectors [e.g. no need to "set jumpers", drive-address being set automatically under Host control, and all " other jumpers⇌being preset]. Different disk sizes are readily supported; the design is conformed to the ANSI-SCSI-2 industry standard.

This system SS will be understood as adapted for high I/O performance, for large-capacity storage (memory), for ease of use/upgrade (cf. modular storage units easy to plug-in, plug-out "on-line") and for a system (data) which is constantly-available.

Figure 2:
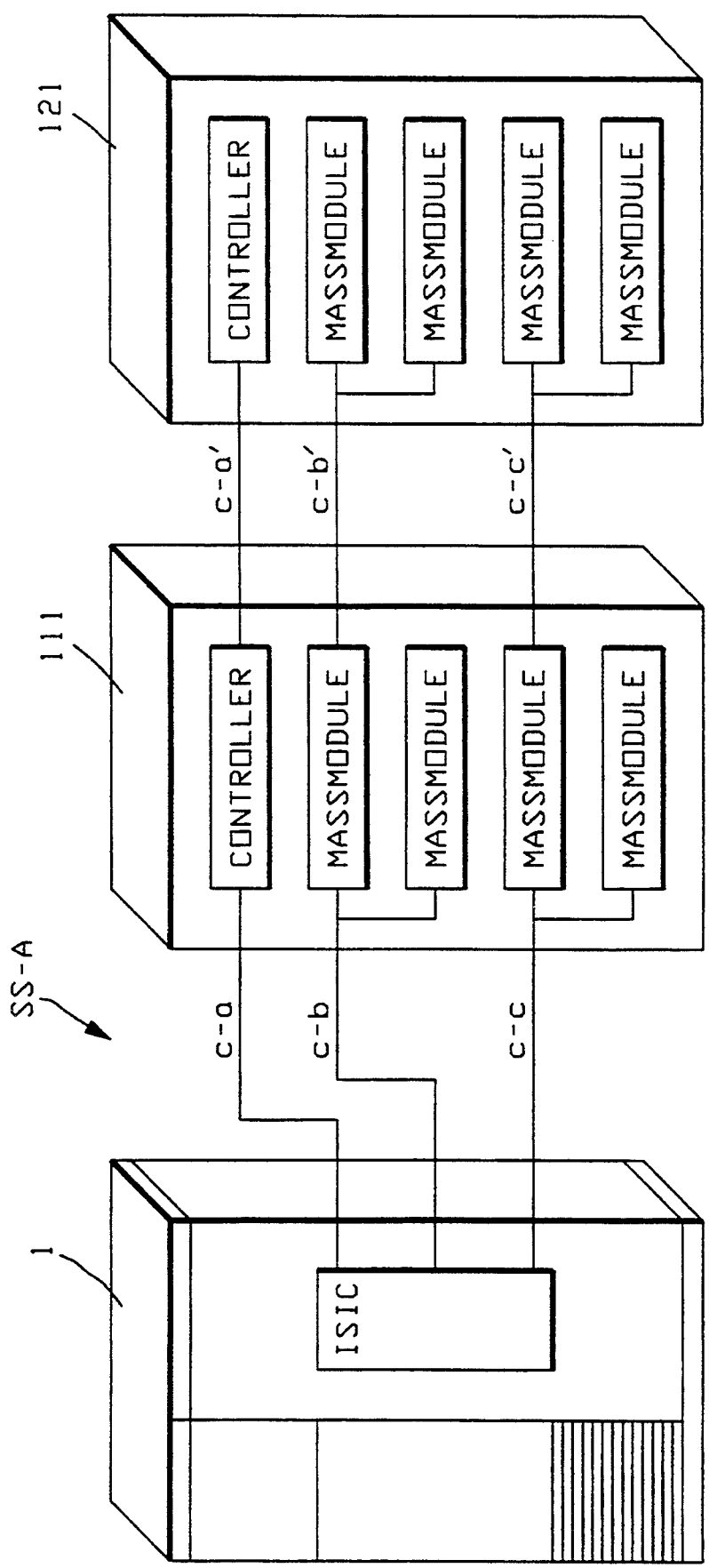

FIG. 2 shows how readily system SS can "grow", depicting system SS-A, a modification of system SS, wherein a second storage unit 121, like unit 111 above, is added, being connected via the same connectors c-a, c-b, c-c as before.

Figure 3:
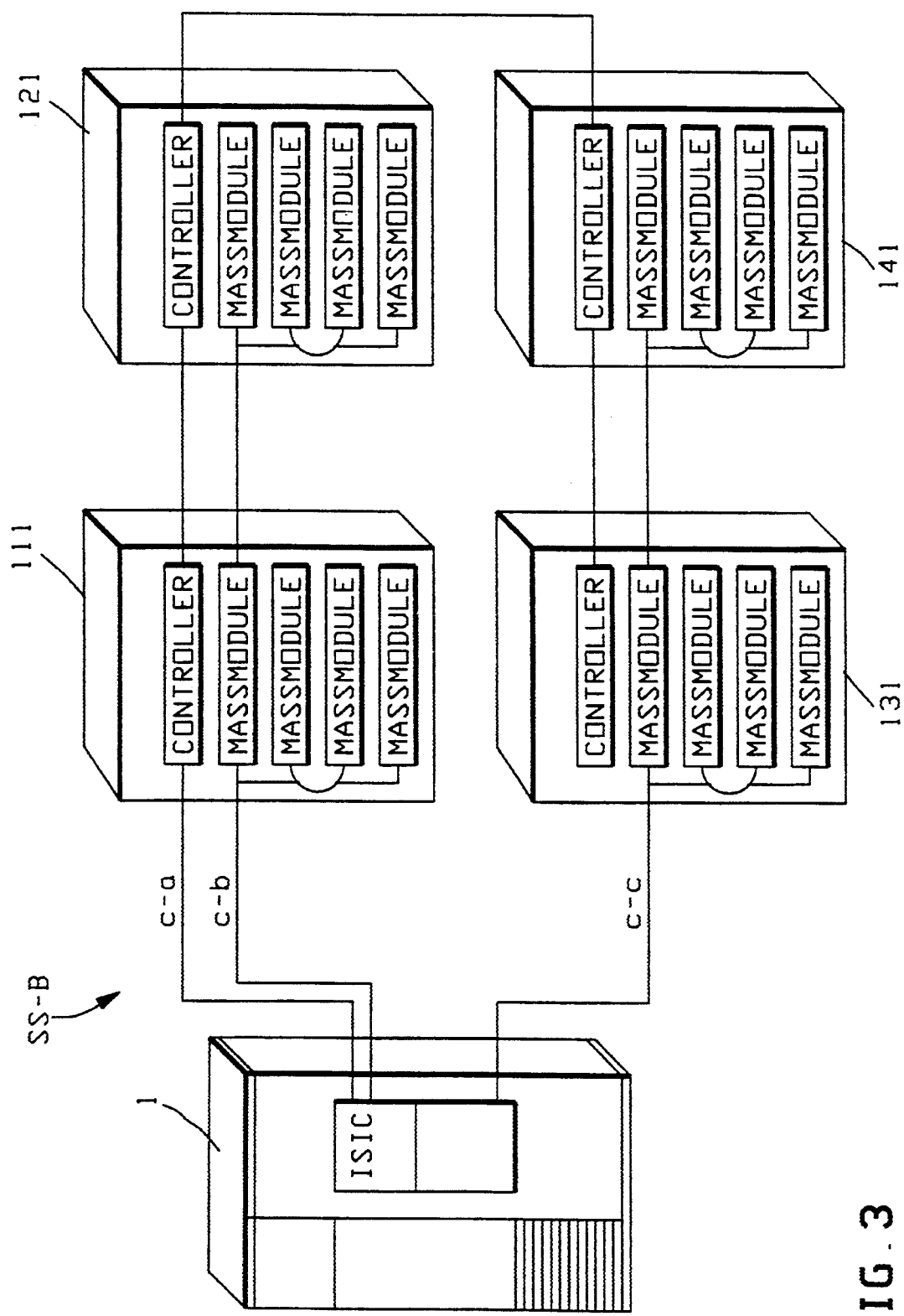

FIG. 3 depicts a further modification, SS-B, where two other storage units 131, 141 are added (to 111, 121 in FIG. 2), taking maximum advantage of add-on capability. In a preferred version of SS-B, each of the four storage modules, or drawers (e.g. drawer 115-A in unit 111) supports a 1.3 MB disk drive. This, in combination with the five SCSI channels, provides about 43 GB of storage [each SCSI channel can support up to 7 drives—thus 35 drives can be strung along five channels for system SS-B—a second ISIC in processor 1 adds two associated SCSI channels; unit 111 reserves two SCSI addresses for tape drives, leaving 33 for disk drives: so $33 \times 1.3 = 42.9$ GB]. This configuration allows one to use the full complement of seven SCUSI targets per SCSI address.

[Host is preferably a "multiprocessing server"; it can handle OPEN/ON-line transaction processing (OLTP), and accommodate one to five 33 MHz Intel 80486 microprocessors, having 16–256 MB of ECC memory.]

In a related feature, the associated software preferably makes a disk partition larger than any one disk drive—doing this by a "Spanning" which joins disk-partitions end-to-end; and/or by "Striping" which joins them in interleaved fashion: both allow creating a file larger than any single drive (striping enhances sequential I/O performance).

Disk Mirroring (Architecture)

The subject embodiments can readily be adapted for "disk mirroring" where a disk's contents are replicated, using associated software, to provide one or more copies of the disk data. Thus, the system can continue operating even when one disk "fails", turning automatically to an alternate record (copy). This can involve creating two to eight copies of a file system; one can "mirror" a single file or a directory, an entire disk drive or a set of drives (e.g. "striped" or "spanned"). Such mirroring gives optimal write-speed when supported by disk redundancy. A 3-way to 8-way mirroring can allow the system to continue in a mirrored state even if one of the disks in the mirrored set is removed from the system. By three-way partitioning, one can provide a "backup snapshot" while disk mirroring continues.

One can rebuild mirrors while "on-line": e.g., taking a drive "off-line" for high speed backup, then reconnecting this drive to the mirrored set. The backed-up drive will then be made to serve as an equivalent to the other drives in the mirrored set while the system is up and running.

With such multiple components in the I/O system (aided by multi-channel design) and with disk mirroring, one can provide useful redundancy: for drives, for SCSI channels, for controllers.

Figure 4:
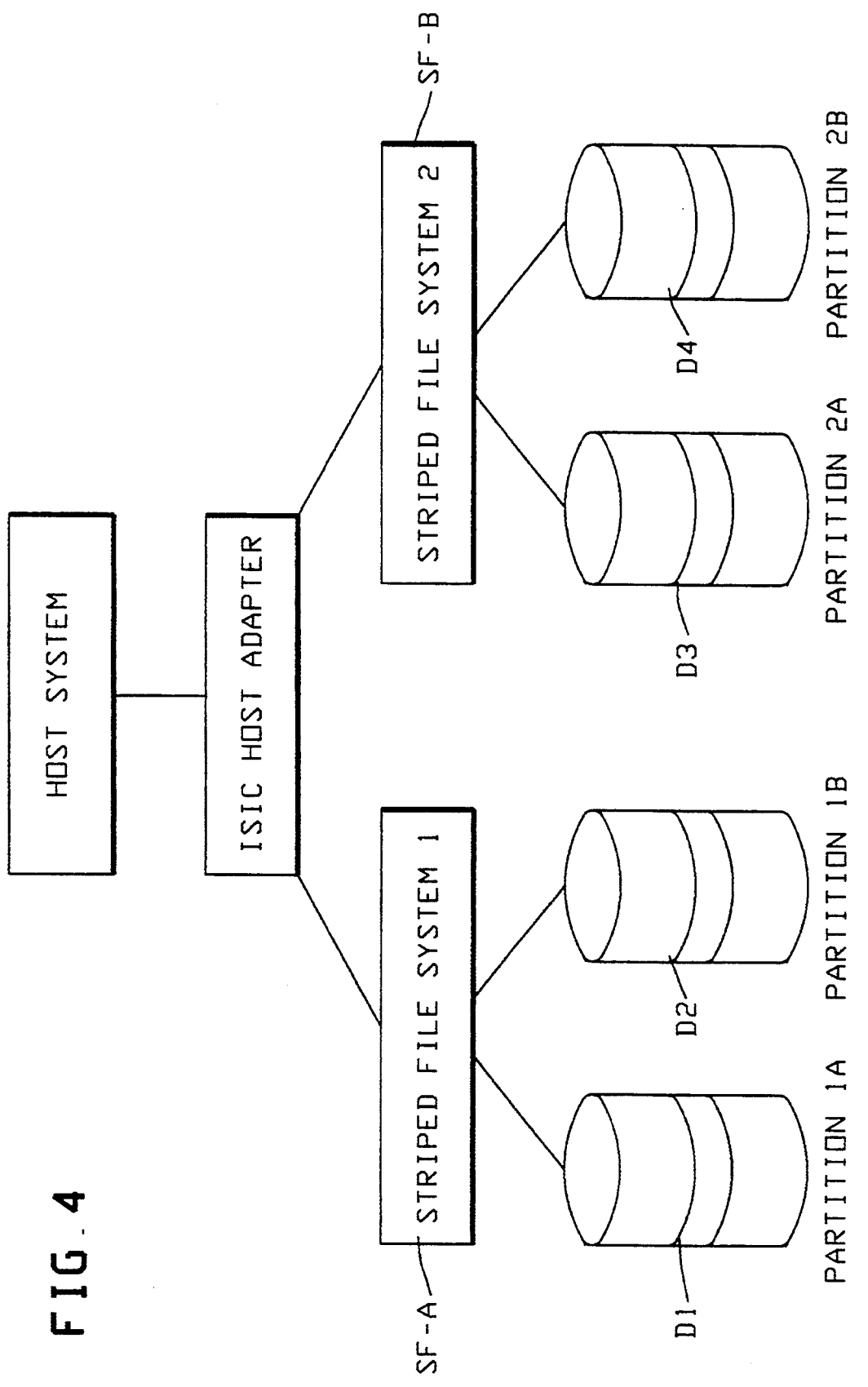

FIG. 4 indicates how two "striped" file systems can be "mirrored". Here, disk drives D1, D2 form a first striped file system SF-A, while drives D3, D4 form a second striped file system SF-B. System SF-A will be understood as "two-way-mirrored" to System SF-B (with partition #1 mirrored to partition #2). For example, if one Striped File System SF-A is on one SCSI channel and another Striped File System SF-B is on another SCSI channel, the SCSI channels may be said to be "mirrored".

If Striped File System SF-A is housed in one cabinet 11-A and Striped File System SF-B is housed in another cabinet 11-B, the cabinets themselves (power, etc.) can be said to be "mirrored".

Hot Removal

As mentioned, a salient feature here is "hot-insert-/removal" (H-IR) capability whereby one can immediately add, replace or remove a drive, e.g., allowing one to remove a drive and lock it in a safe for security reasons; or allowing one to change drives and completely reconfigure the entire storage array—doing this while the system stays fully on-line, vs. waiting for "off-hours". This is further detailed below; e.g., see FIGS. 13A, 13B, 13C. H-IR is preferably performed under Host control, for optimal security of disk data; thus, panel lights on cabinet can indicate when a drawer 115 is "ready-for-removal"; until then it remains locked-into its cabinet. Of course "disk mirroring" allows system operation to continue if a drive "fails"; but the drive must be replaced;—without our H-IR capability replacement would typically interrupt system operation.

With this H-IR feature, no storage unit (e.g., drawer 115) can be removed without HOST permission (e.g., files can't be unmounted from associated disk). Each drawer is thus "locked" into its storage cabinet until permission is given; panel lights (e.g., on cabinet, and on processor) indicate this permission (also indicated, preferably, by automatic "cocking" of the so-released drawer's handle—details below).

Dual Initiation

"Dual Initiation" allows one (or several) units (e.g., 111, 121—see FIG. 2) to be shared by multiple processors. This configuration furnishes "system-mirroring" so that if one processor (or software) fails, the other will automatically take over (until the first is re-initialized). A dual initiator configuration has two host systems connected to a single Storage Cabinet (e.g., 10, FIG. 6A). In the first Storage System, one host system would be actively working with the disk drives in the Storage Cabinet while the other host system is on standby. If a problem occurs with the first system that does not lock up the SCSI channel, the following would happen:

The first system is stopped. If turned off to reset it, it is turned on again.

The disk drives were initially "reserved" by the first system. They would be "released" from the first system and then "reserved" by the second system.

The second system would verify the state of the disk drives, initialize them if needed, and restart the application.

Figure 5:
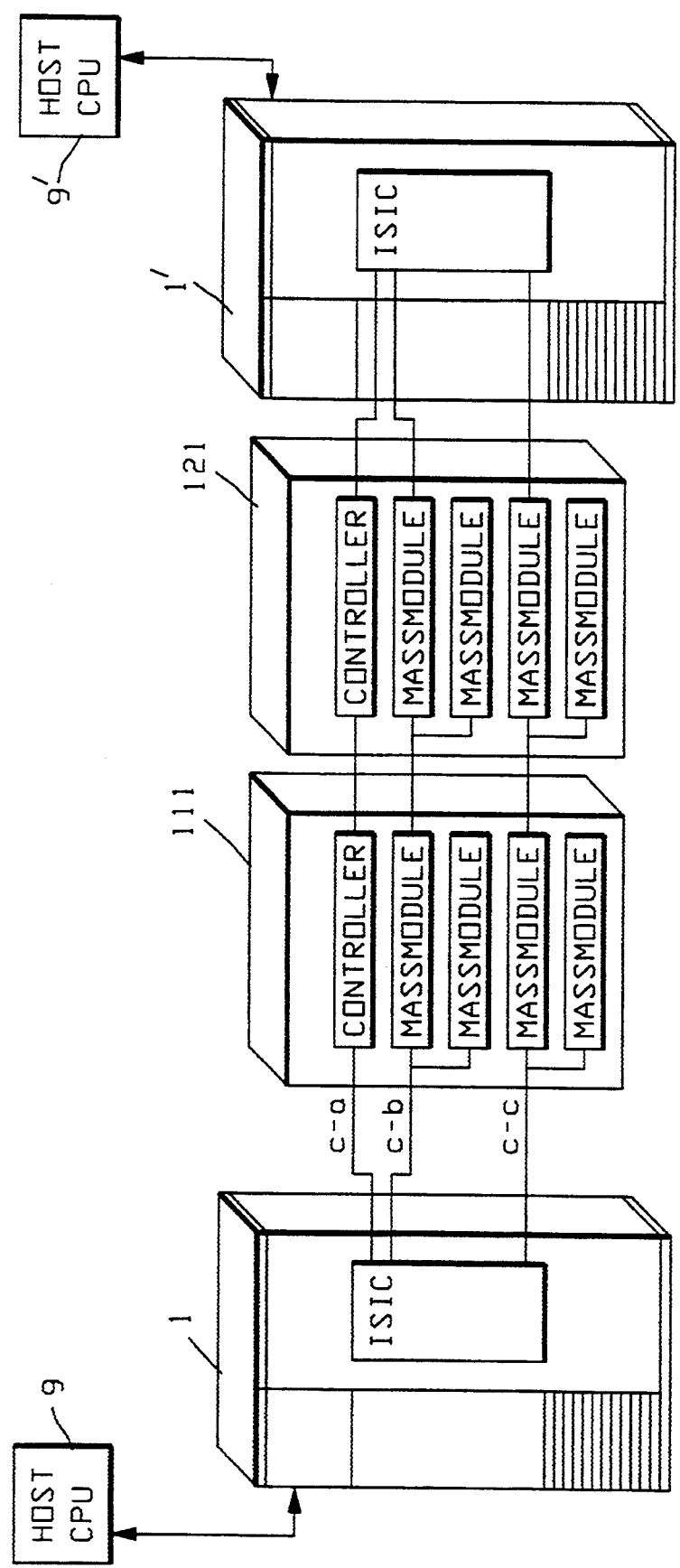

For "Dual Initiator" mode, the system is provided with a second, "standby" processor 1' (FIG. 5, in addition to primary processor 1) for a disk drive plus associated software. Thus, while processor 1 runs normal applications, standby processor 1' is kept available as its substitute (e.g., it can run other applications thewhile). But should processor 1 "go down" (assuming a "dual initiator" configuration), the following happens:

1. The drives in the cabinet are "released" by the primary system host 9 and processor 1 when the SCSI bus is reset . . . ; then
2. These drives are then "reserved" by the second system (Host 9', processor 1') and the system and disk information are initialized; then
3. The application is restarted on the second system. [Software assigns drives to Host 1' when it goes "ON" as the replacement.]

If the "UPS" option ("uninterruptible power supply") is included in the system and power fails (e.g., to storage unit 111): after a prescribed time (e.g., 10 sec.), The UPS capability will see that the system host is automatically notified of this condition; e.g., Host is then advised and a staged, orderly shutdown is executed. An uninterruptible power supply is much valued (power interruption is the most likely cause of system interruption).

Mass Module

Figure 6A:
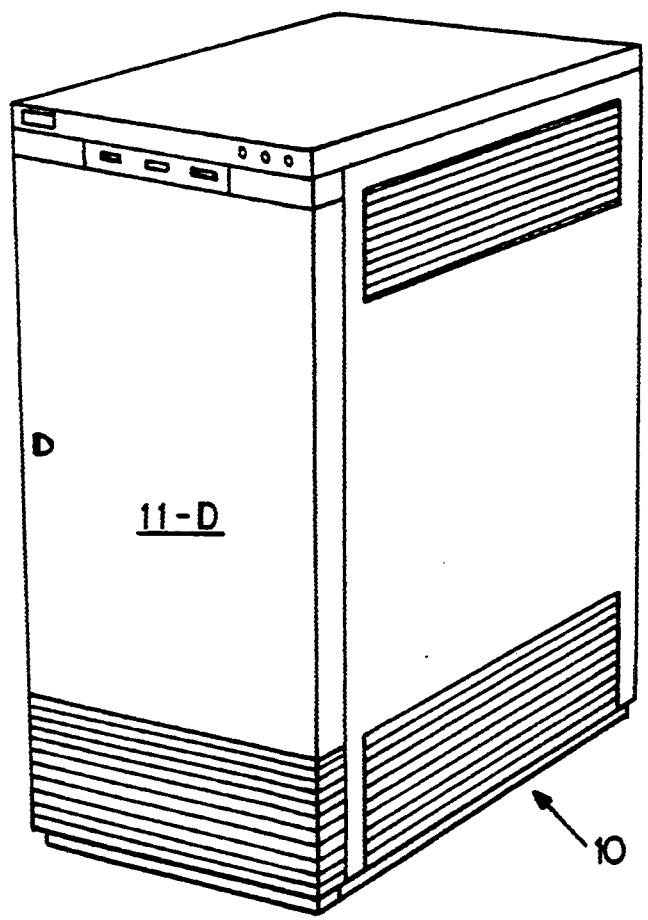

Storage Cabinet: FIG. 6A schematically illustrates a "Server PC Intelligent Mass Storage Cabinet" 10 that will be understood as providing mass storage capabilities to users of a Server PC (Server) product family, e.g., to be used as the high performance I/O mass storage system for Server PC's. This cabinet 10 brings the feature of drive removability to server products with the addition of a differential SCSI controller and associated software.

Figure 6B:
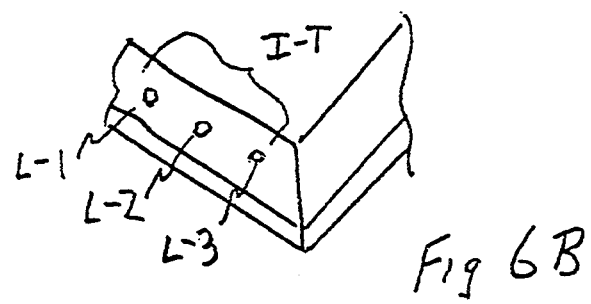
FIG. 6B is an enlarged showing of a portion thereof.
Figure 6C:
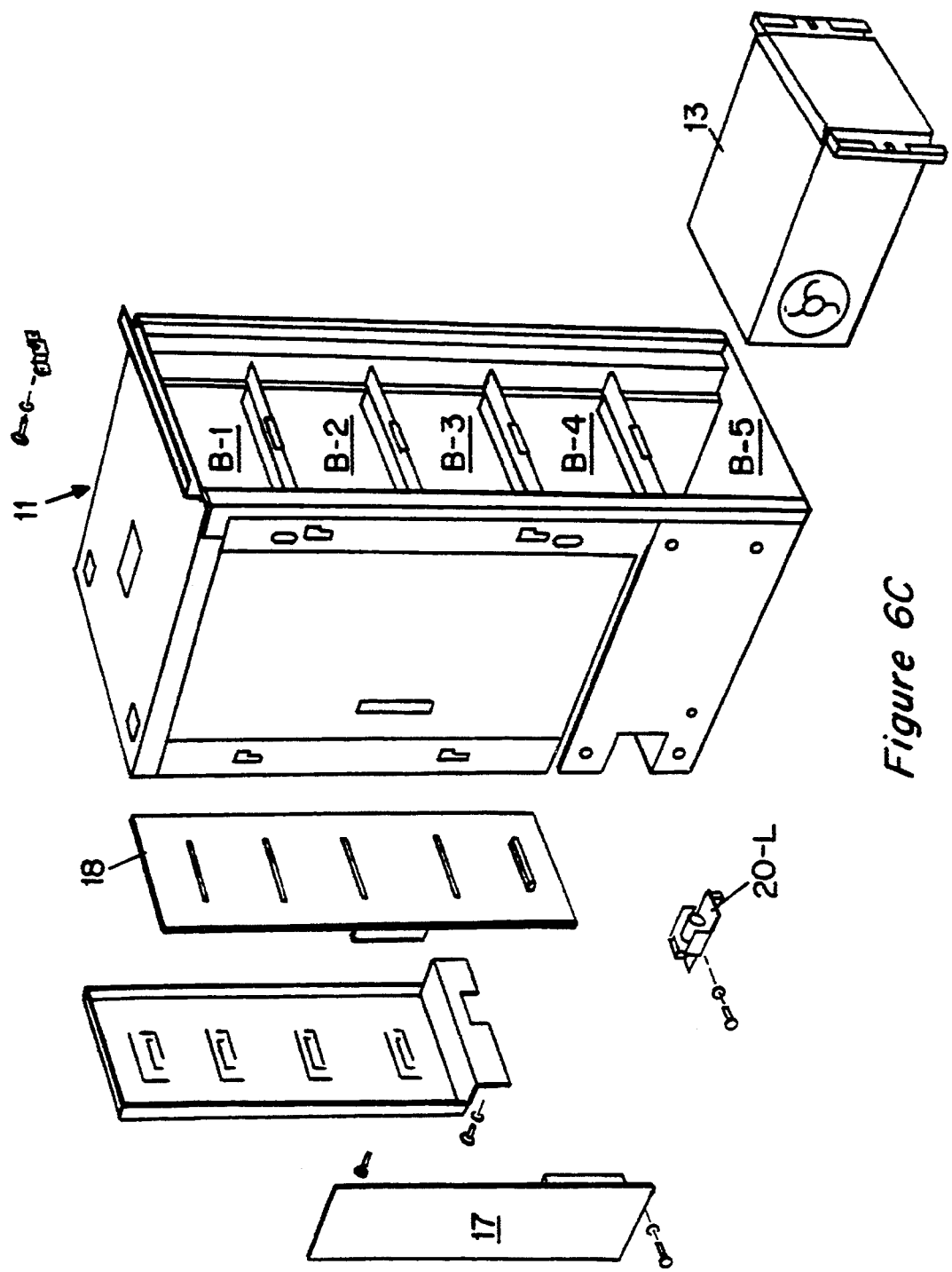
FIG. 6C, 6D are like assembly depictions of sub-assemblies thereof, with parts exploded-away.

Cabinet 10 will be understood as including a signal panel (FIG. 6B, lamps L-1, L-2, L-3). Cabinet 10 is shown in FIG. 6C with its skins (top, back, sides) and front door 11-D removed, revealing a power supply 13 shown exploded from the bottom-bay and four identical memory bays B-1, -2, -3, -4, along with I/O control board 17 and backplane 18, plus a drawer lock 20-L shown exploded away from bay B-4 (B-1, B-2, B-3 also have one).

Cabinet 10 in this preferred embodiment offers many special user features, including:

1. On-line disk drive-drawer removal/replacement, which allows users to remove/replace disk drives without the usual powering-down;
2. Ruggedized "MemoryModules" 20 (see below and FIG. 6E); each housing storage drives. Modules 20 provide extra protection against rough handling during drive removal from, or insertion into, the Cabinet 1; and
3. Dual SCSI channels enabling users to "multi-channel mirror" within the same Cabinet for data redundancy and enhancing performance.

Cabinet 10 offers the user tens of gigabytes of mass storage, and so is well suited to support a Server PC product line in On-Line-Transaction-Processing (OLTP), for Large Data Base and Image Processing marketplaces.

Cabinet 10 comprises a floor-standing housing 11, (FIG. 6C) providing the five bays, four of them each accommodating a removable MemoryModule or drawer 20, capable of holding one fixed disk drive or two half-height drives (disk or tape). A number of cabinets 10 can be inter-coupled and placed side-by-side (each cabinet is free standing) to form a single integral composite mass storage system. Multiple cabinets may be used depending on the number of Intelligent SCSI Interface Controllers (ISIC's) installed, on available floor space, on cable length, etc.

Figure 6D:
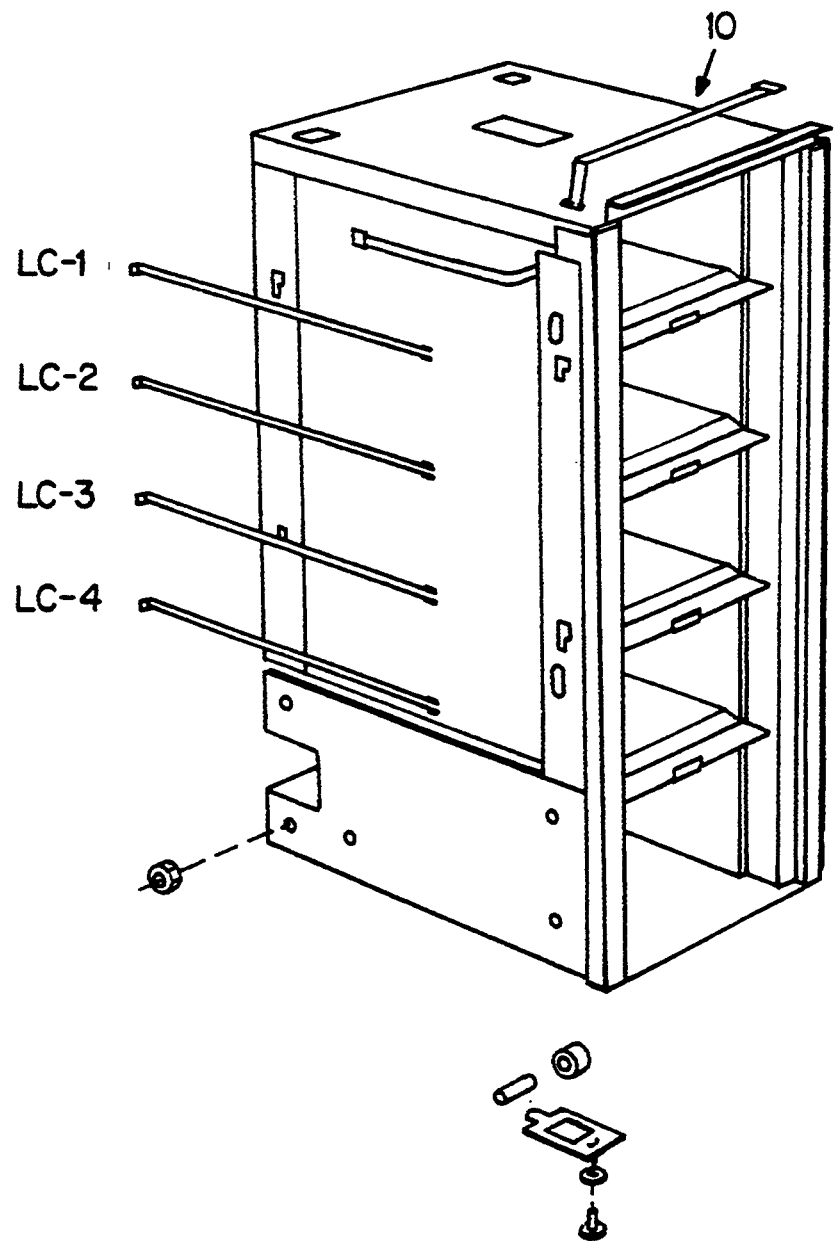
Figure 6E:
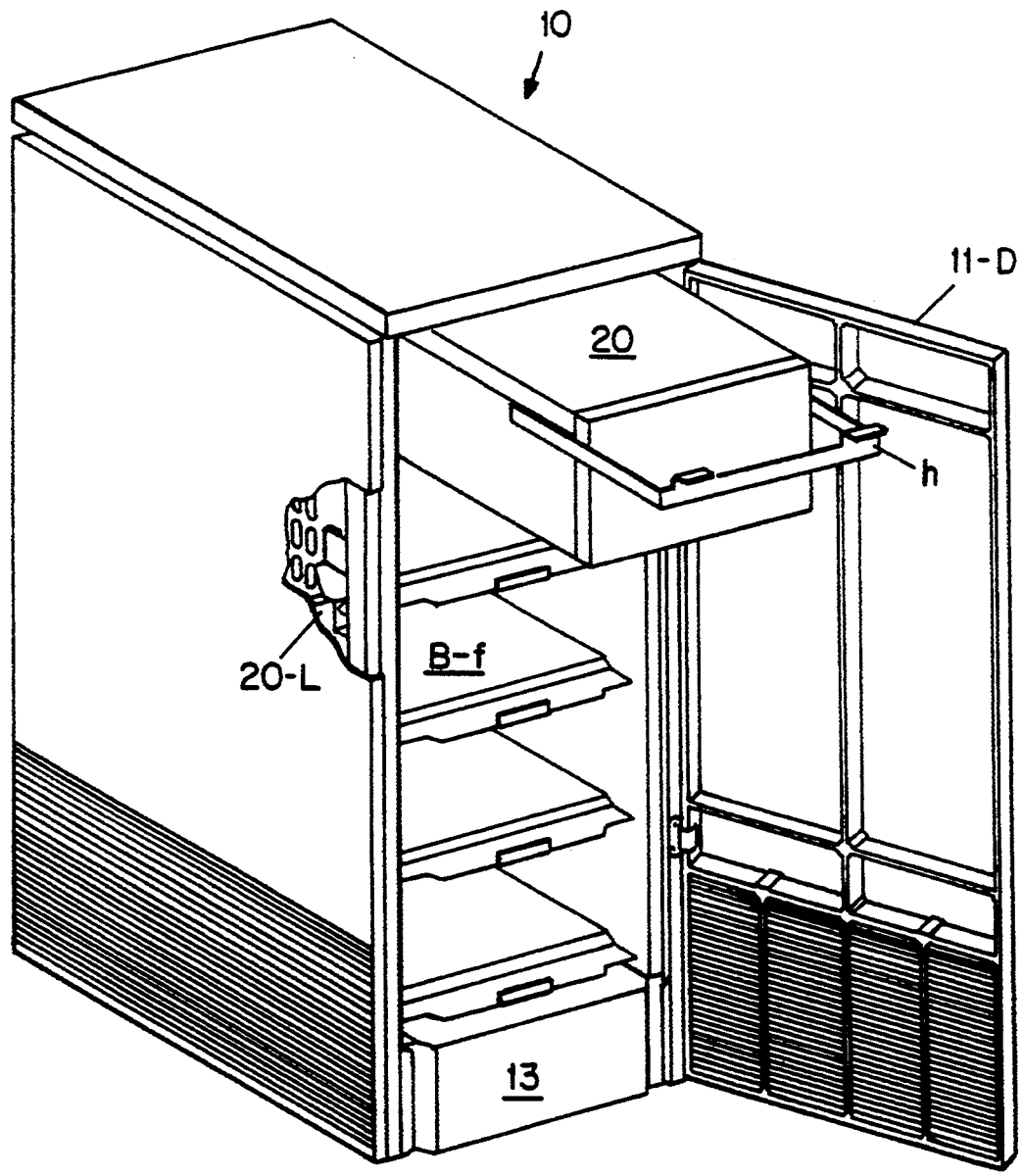
FIG. 6E is a like depiction with door open.

Each bay (one of four pockets or receptacles for receiving any modular drawer) is identical and will be understood as formed by respective shelf-floors (B-f, FIG. 6C) spanning the cavity between cabinet-sides, while being fitted with a status-LED 20-LL, plus a lock-assembly 20-L (see also FIG. 6E). Each shelf-floor B-f includes a lip or catch B-LL on its forward edge to require the user to lift-out a drawer with both hands (see FIG. 6E, and below). Closing the rear of bays B-1 etc. is a common Backplane 18, while an I/O Controller Board 17 is mounted along the cabinet side. Each bay has a cable L-C (FIG. 6D) connecting its locking solenoid to power, Host, etc.

Each Cabinet 10 also has the following features:

A. Can support either one SCSI bus (data from, to SCSI devices) with up to four drives, or two SCSI buses, each with two drives, to maximize performance in standard or "mirrored" configurations,
B. Allows removal and replacement of the MemoryModules 20 while the host system is running ("hot-removal"); the Host System controlling Module-removal and -replacement (e.g., via a Serial Port RS-232 or 422).
C. Monitors I/O system operation to assure that the host system is notified in event of Power Outage (through UPS port) or Cabinet failure.
D. Sets the SCSI address of each MemoryModule 20. This simplifies configuration of a large system by providing overall centralized control of drive addressing. Software packages will take advantage of an associated "Auto Addressing" hardware feature to provide Hot Standby for drives.

E. Provides a locking system to ensure that no Module 20 can be removed from a Cabinet without host intervention; this can be overridden only by cabinet disassembly for service needs.

Each Cabinet 10 can be segmented into the following subassemblies (functional replacement units) within the main cabinet (see FIG. 6C):

one to four MemoryModules 20 (includes drive)
a power Supply 13, including a Fan Assembly 15
an I/O Controller Assembly 17
a Backplane 18
a Solenoid Assembly 20-L at each memory-bay (for locking/release of its Module 20)

Cabinet 10 is easily maintained through the use of a special diagnostics test and with these few Functional Replacement Units. And each Cabinet 10 can handle any combination of the following types of SCSI storage devices:

SCSI hard disk drives (half-height or full-height)
SCSI (DAT) tape drives
SCSI Optical disk drives Indicators Three LED Status indicators L-1, L-2, L-3 are located in the top cover I-T of the Cabinet (FIGS. 6A, 6B, details below). A user can view these without opening the front door.

The housing 11 consists of a sheetmetal enclosure, designed for EMI/RFI control, with plastic skins attached thereon for ergonomic and aesthetic purposes. The front of the cabinet has a door 11-D that provides access to the four Modules bays, stacked vertically. (See four Module-bays B-1, B-2, B-3, B-4). The Cabinet is powered through its backplane 18 by a 300-watt power supply 13, located in bay B-5, located below the bottom Module bay, B-4.

Two fans (each operating at half-speed for extended life) cool the entire Cabinet. If one fan fails, circuitry in the fan tray switches the remaining fan to full speed, so that the Cabinet remains adequately cooled.

The MemoryModules, power supply, and fans are all accessible and removable from the front of the Cabinet. The I/O controller 17, backplane 18, status panel 11-SP, and locking solenoid assemblies 20-L (four, one for each module bay, with connectors L-C1, -C2, -C3, -C4, FIG. 6-D) can be removed after disassembling just a few plastic and sheetmetal panels. (See half-removed Module 20 and its lock 20-L in FIG. 6-E.

Cabling for each Cabinet is as follows: three SCSI cables are used with a one-foot length to jumper the upper SCSI bus to lower SCSI bus, one or more two-foot-lengths to inter-link Cabinets and a nine-foot length linking a Cabinet to its Host.

A ten-foot cable (RS-232-C/RS-422-C) connects the Host to the Cabinet's internal controller.

FIG. 6-F is rear view of cabinet 10, schematically indicating ports for RS422 (two), RS232, and power (UPS-13), an upper and lower SCSI bus Bus-1, Bus-2, a thumbwheel to set the "cabinet Number" for the Host and a 4-position dipswitch to indicate (to host) how the SCSI buses are configured [e.g., jumpered, or one or two connected].

MemoryModules 20 (Details)

Each Module (drawer) is preferably configured as embodiment 20 (see FIG. 7), being designed to house one full-height (5.25") device or one or two half-height devices. Drawer 20 is ruggedized (e.g., vs. shock) by providing additional "isolators" (shock mounts 20-S) external to a 5¼" device installed therein. A "dual half-height" Module is designed to hold removable-media devices (tape or disk). An interface control board 20-CP is mounted at the rear of each module 20, to provide connection to the backplane 18 and the interface circuitry for on-line removal and installation. A 5¼" device (e.g., hard disk drive 20-HD), installed in a module 20, connects to this board 20-CP via a fifty-conductor cable, thus affording flexibility in connector location (on the 5¼" device). Another cable connection allows for auto SCSI ID (software selectable), to relieve the user from the need to manually set "SCSI ID jumpers" on devices.

Each MemoryModule 20 thus houses the mass storage devices along with an interface control board that provides buffering circuitry for online insertion and removal, that provides SCSI ID select, and that connects the SCSI backplane (only one for 4 modules) to the drive. Each Module 20 is designed to:

a. provide Non-Operational Shock-Resistance (e.g. to withstand a Module rotational drop as might be seen during bench-handling or testing—see shock mounts 20-S);
b. provide Current Limiter Circuitry to aid in drive removal and replacement and to eliminate "glitches";
c. provide a locking system as part of its Cabinet bay to ensure that a Module 20 will not be removed from the Cabinet without Host enablement. (This lock can be overridden only by cabinet disassembly for service needs); and
d. provide connection for differential SCSI, 8- or 16-bit SCSI drives via 96-pin and 48-pin DIN connectors (at the rear of Module).

Each module 20 also has a unique locking handle H (e.g., see FIGS. 6-E, 8, 9) that is used during installation to help manually "pry" the module into its storage bay, to help it make electrical connection to the backplane ("pry" it in), and to enable automatic lock-in of the module, with the cooperating lock assembly 19 installed at a given bay. It is also used as a carrying handle when the Module is transported (e.g., from Cabinet to Cabinet or to a secure area for storage.

Cabinet I/O Controller Board

This board (printed circuit array, PCA, mounted on I/O assembly 17, See FIG. 6C, for each cabinet) is designed to control all the miscellaneous functions of Cabinet 10, and includes a RS422/232 communications port for passing commands and "status" signals to and from the Host computer. (This port is configured as RS422 or RS232 automatically when the communications cable is inserted on the Cabinet). The functional support includes: Module configuration status, SCSI device ID programming, Module Lock/Enable Control, and LED Control. A UPS (power) interface will also be supported on this board B-I/O. (An Intel 80C196KB 16-bit embedded micro-controller is preferably used to implement these functions.) A 32K×8 EEPROM is used for program memory and also allows the Cabinet configuration to be stored. Also provided is 8K of static program memory. Multi-function I/O ports allow Cabinet control and status to be obtained. This Control Logic PCA B-I/O will connect to the drive modules through "backplane PCA" 18.

This microprocessor (80C1196KB")-based PCA (card B-IO) also contains logic for the following (four) external connections:

Two RS422 ports to allow "daisy-chain" connection of multiple Cabinets; and to also support a "Hot" drive remove/replace feature;

One RS232 port to support related systems with the addition of a differential controller and software;

BACKPLANE board to enable the "remote drive addressing" feature and to enable drive removal and replacement; and Front Panel LEDs for Power, System Activity, Drive Removal and Fault Conditions.

Card B-10 also contains address information (related to addressing its Cabinet) in order to:

a. Determine and store in non-volatile memory the SCSI address of each of the drives and Modules inserted within the cabinet;

b. Determine if the Cabinet is wired for one or two SCSI Channels and retain the channel address of each Module 20 (a manual "dip switch" at the rear of the Cabinet is set either for "single" or "dual" SCSI Channel operations);

c. Determine if there are multiple drives within any module 20 and allow each to be addressed individually;

d. Record and store the address of the Cabinet 10 itself (this is set by the user from outside the cabinet via a labeled switch);

e. Control the "handle unlock" feature for each inserted module; and f. Determine if the power-supply fan(s) are functional by reading status lines from the fan module.

Backplane

The backplaneboard 18 of each Cabinet 10 is designed as an interconnection between all drive modules, PCA control logic, and the external SCSI interfaces. Backplane 18 (e.g. FIG. 6C) consists of two separate SCSI buses; each bus comprising two sets of (96-pin and 48-pin) DIN connectors to interface to the drive modules and two external SCSI (e.g. AMPLIMITE 0.050) connectors for Host, Cabinet or bus connectivity. Both buses may be jumpered to each other to make a "four-drive bus", or may be linked to other Cabinets to accommodate up to seven SCSI devices on each SCSI channel. This allows great flexibility in configuring a mass storage system.

Backplane 18 is designed to support 8-bit differential SCSI via a 50-pin external connector. (Or alternately, to support 16-bit differential SCSI via a 68-pin connector.) Use of a Fast/Wide differential SCSI is also feasible.

Figure 7:
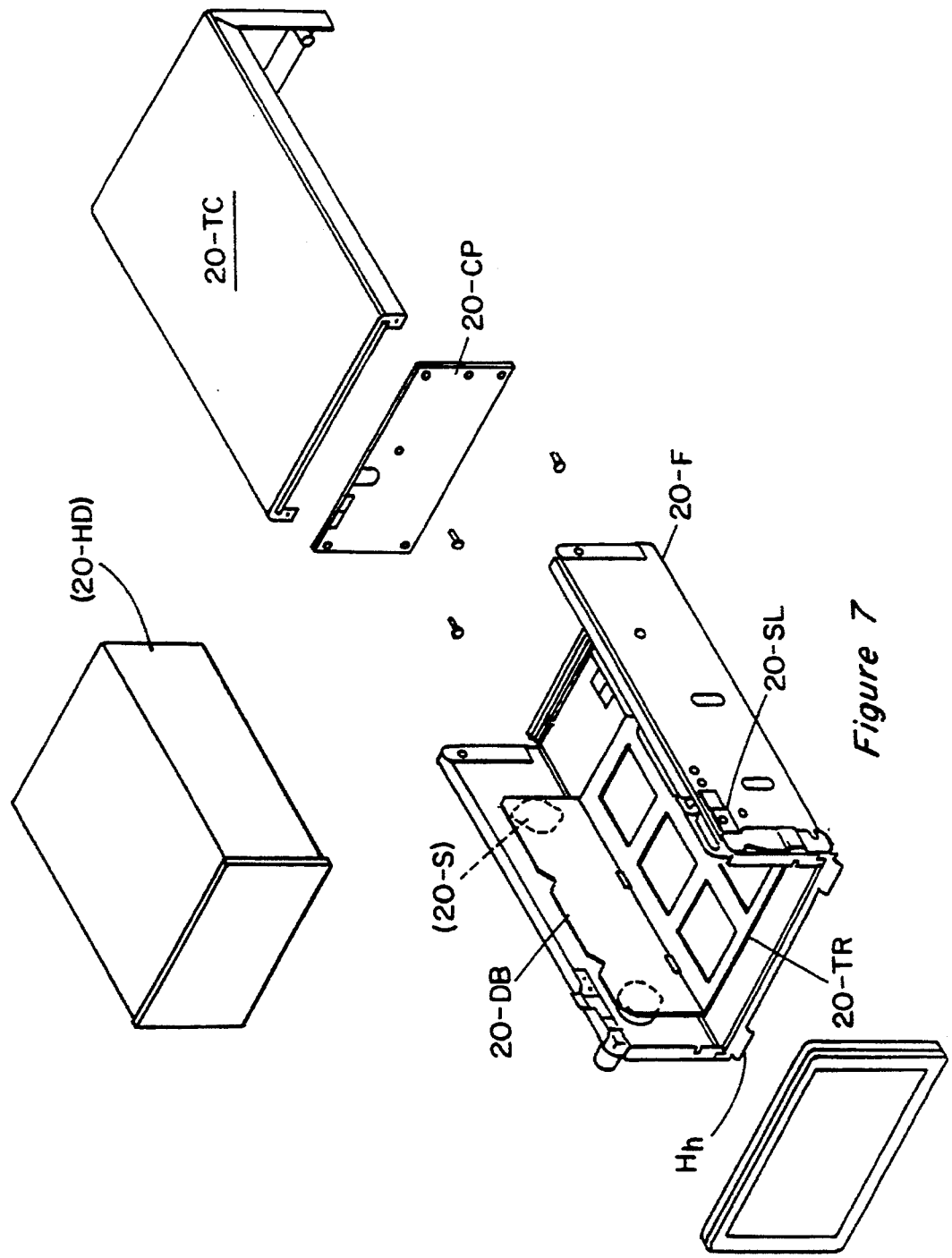
FIG. 7 shows a preferred module (drawer) in exploded view.

An exemplary memory module, or drawer, 20 is depicted in FIG. 7, with parts exploded-away for clarity. Drawer 20 comprises a frame 20-F (two sides joined by a base) covered with an L-shaped top cover 20-TC, and with a front bezel 20-B (preferably Translucent to reveal signal LED) and handle H, being closed at the rear by its interface controlboard (PCA 20-CP) mounted on cover 20-TC.

Interface control board 20-CP (see FIG. 7) is mounted at the rear of each drawer 20 for connection to the Cabinet backplane 18 and also to interface circuitry for "online" installation and removal of the drawer, as described below. For example, a 5¼" disk memory device may be connected to this board 20-CP via a 50-conductor cable, thus allowing flexibility in the connector-location on this device., Another cable (to drive PCB; cf SCSI-ID-header pins) accommodates auto-SCSI-identification which may be software-selectable—relieving the user from the need to manually set SCSI jumpers on devices.

Drawer 20 is adapted to enclose one (or two) removable drive package(s), each containing a disk drive (or two, or a tape drive—see hard disk drive unit 20-HD, e.g., preferably including a Translucent window hd for viewing signal light) removably-mounted in a tray 20-TR, which is suspended from frame 20-F on four shock-mount means (e.g., shock-mounts 20-S, in phantom—only shown for one side). A pair of spring-locks 20-SL are mounted at the front of each drawer-side to latch handle H (to be projected-out as in FIG. 8, for carrying drawer 20).

Insertion/Locking of MemoryModule

As mentioned, each MemoryModule (drawer) 20, according to a feature hereof, is provided with an insertion-aiding/removal-aiding handle-lock array plus associated switches and control signals. This automatic Lock/Release system assures that Module 20 will not be inserted or removed (cf. its handle cannot be moved) to/from a Cabinet without host (microprocessor) intervention and approval. The handle will be shown to interact with the lock-in controls 20-L mounted along the side of each bay.

Thus, it will be seen that the system will not allow a drawer 20 to be removed without Host permission; however, it can be "illegally" inserted (without Host permission), although this generates a warning, ("solid amber" on the cabinet states LED)—"illegal" being understood as before.

Figure 8:
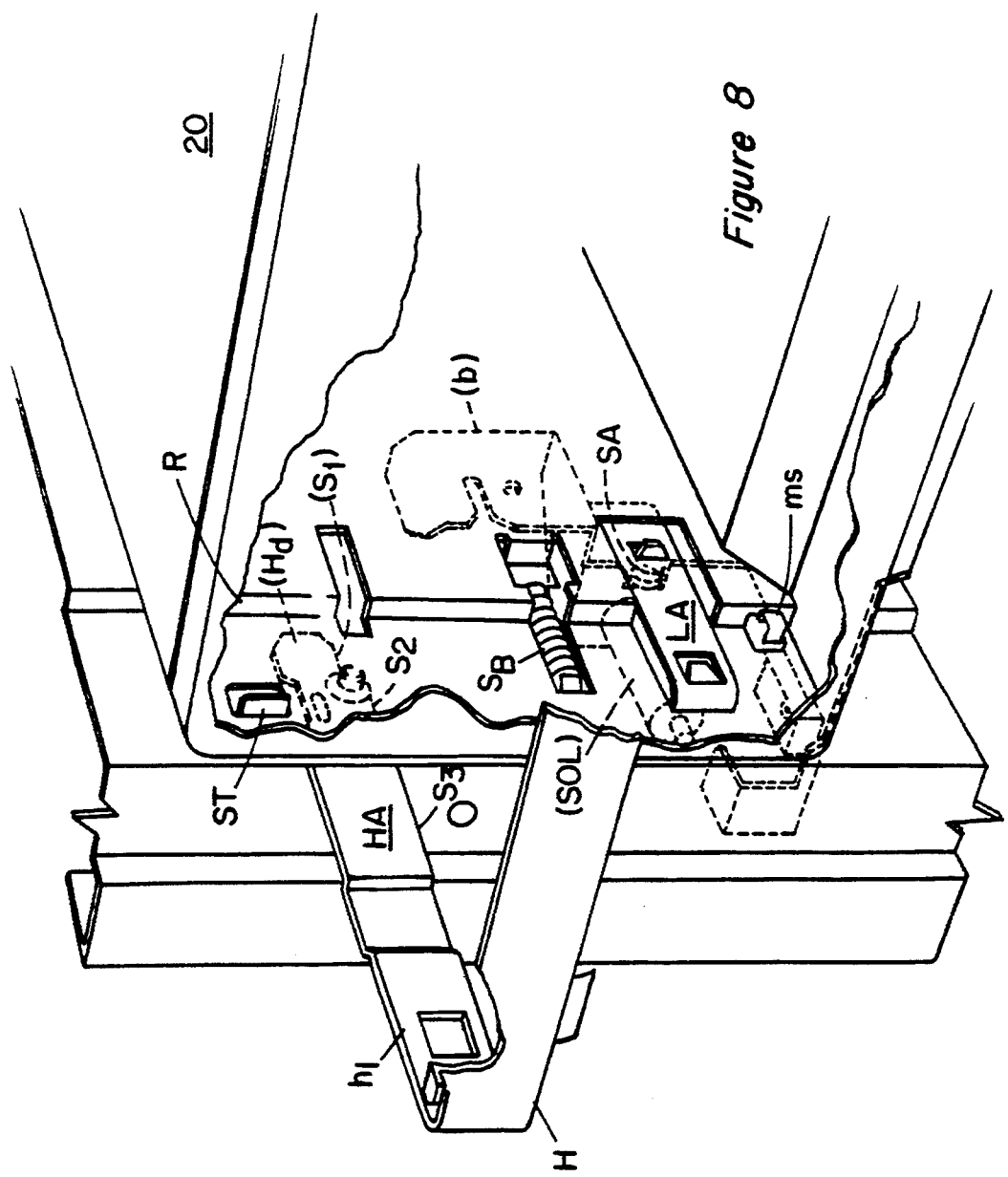
Figure 9:
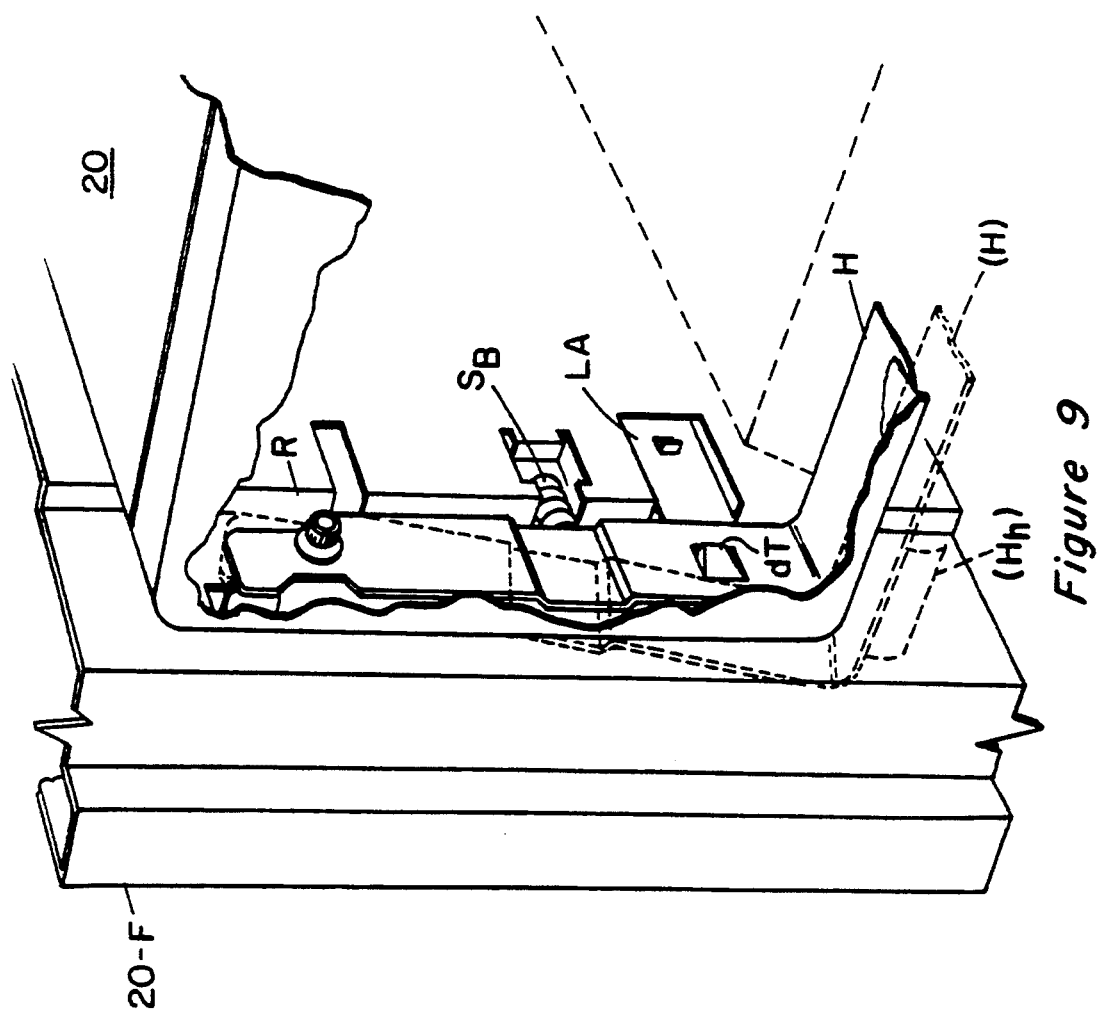

A preferred embodiment of such a system is now described, with part of one module 20 including its handle H depicted in FIGS. 8, 9. Handle H will be noted as serving as a carrying-handle, when projected-out as in FIG. 8, for its module (drawer) 20; e.g., during transport to or from a Cabinet 10, or to or from a storage area. Handle H also serves as a guide/pry/lock-engager during insertion of its drawer 20 into a Cabinet bay; e.g., guiding the drawer into its bay, prying it in with leverage to aid in seating its pin-connectors (making electrical connection to the backplane at the rear of each bay) and locking it full-in.

Figure 8A:
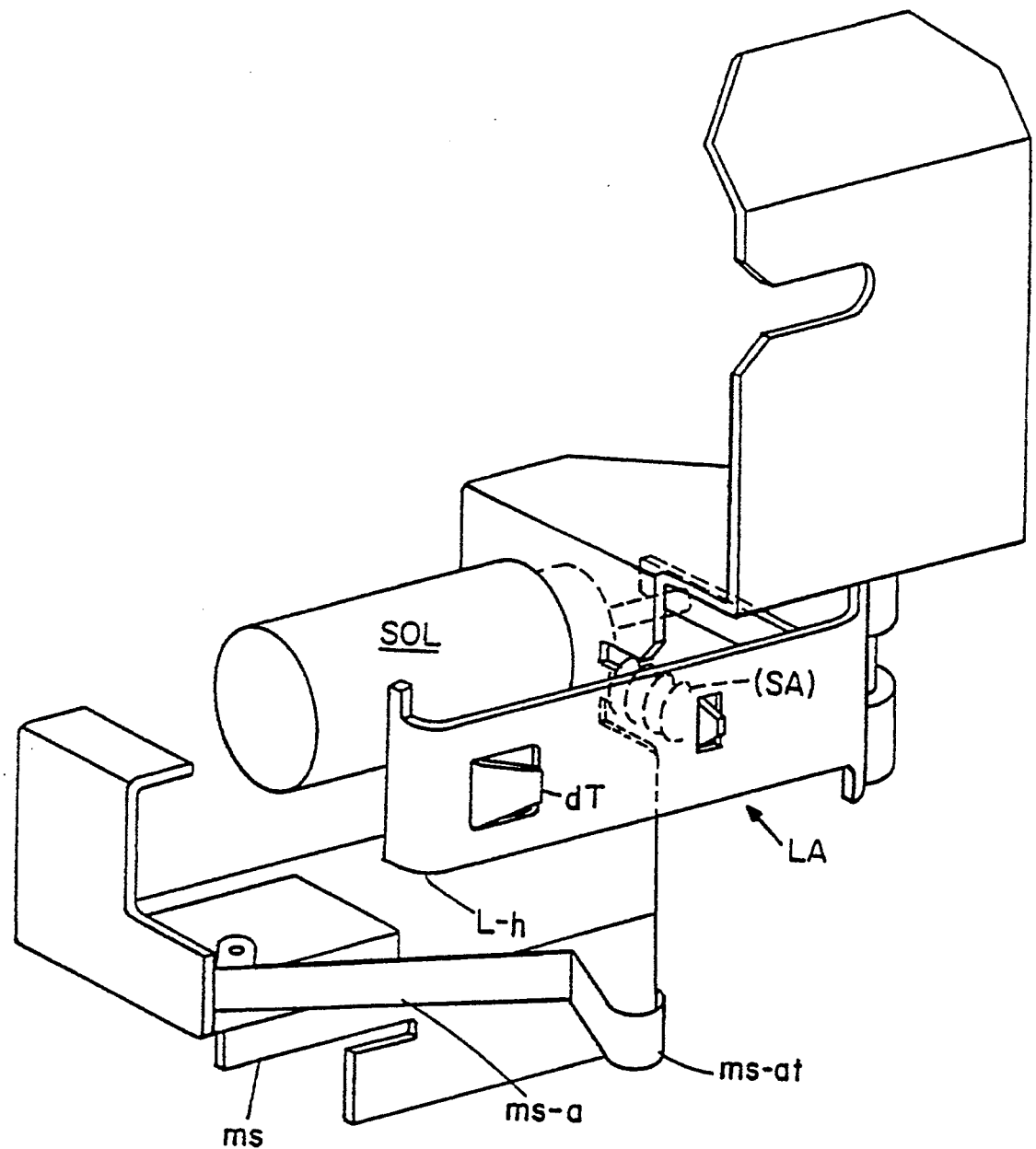
FIG. 8A depicts, in front enlarged elevation, the latch for such a bay and module, with FIG. 8B showing a rear view of this latch and FIGS. 8C, 8D showing portions thereof and FIGS. 8E, 8F showing a hold-out spring for the module-handle, and FIG. 9 showing a similar view to FIG. 8, but with the module inserted into its bay and its handle "kicked-out"
Figure 8B:
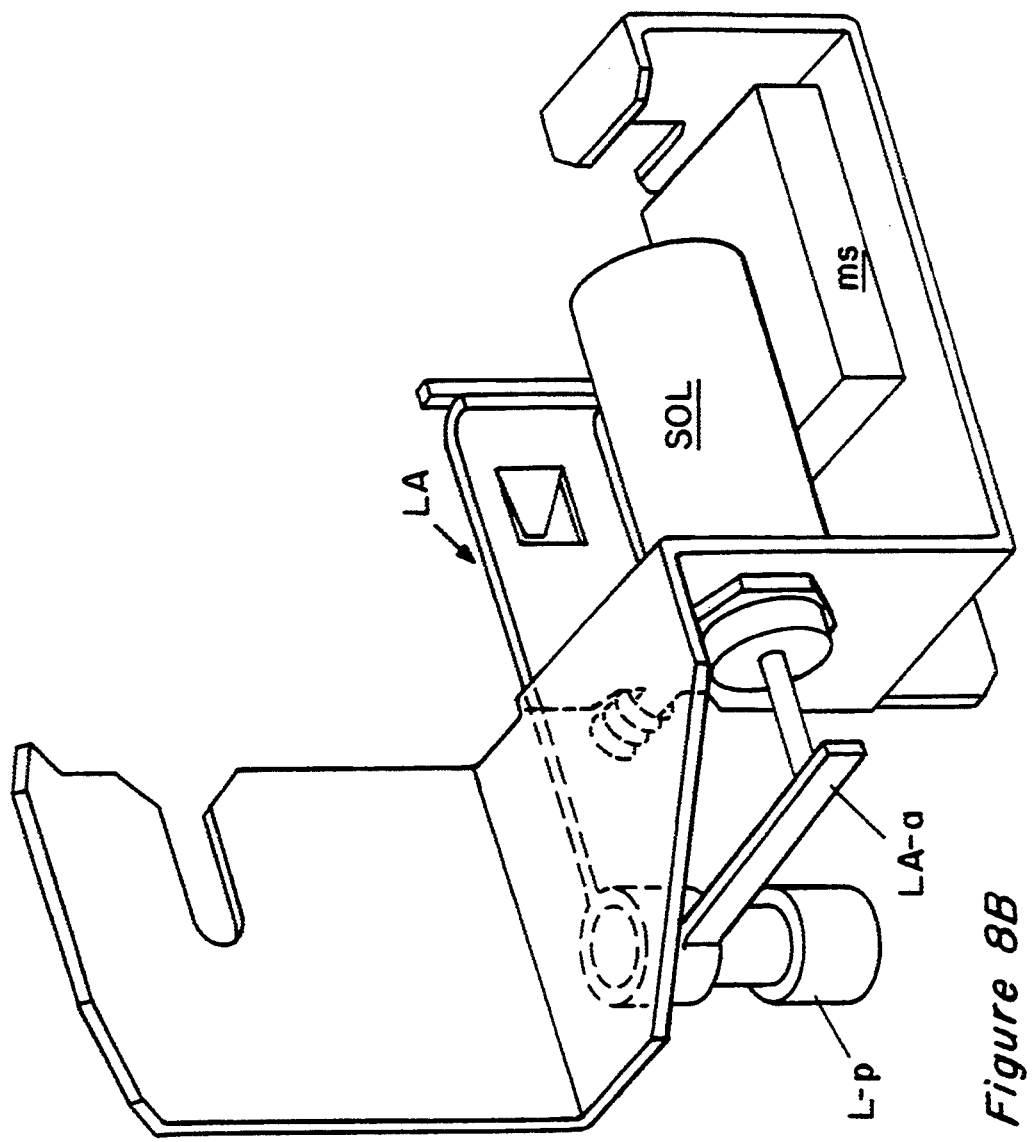
Figure 8C:
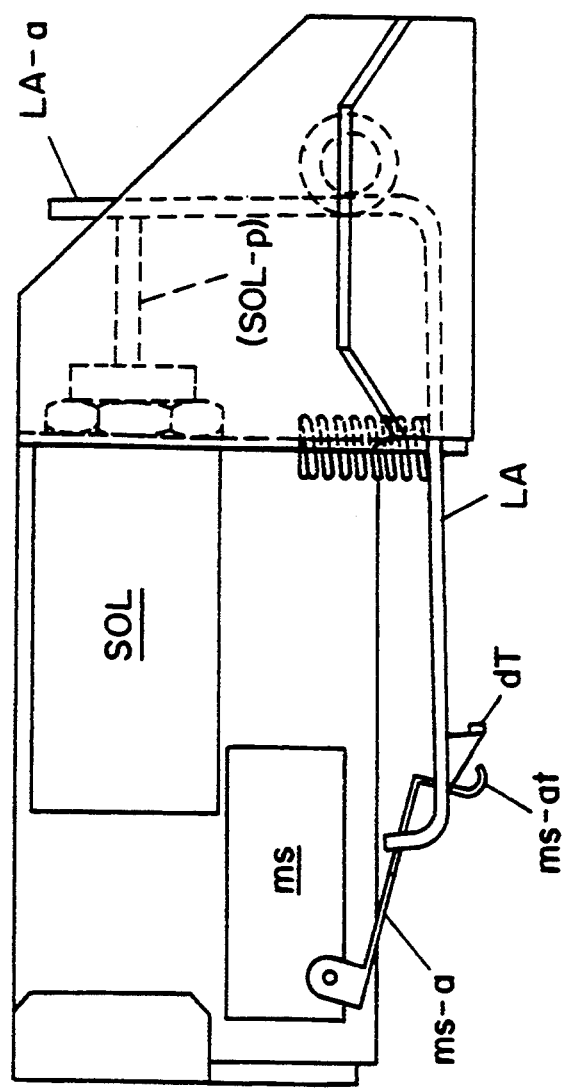
Figure 8E:
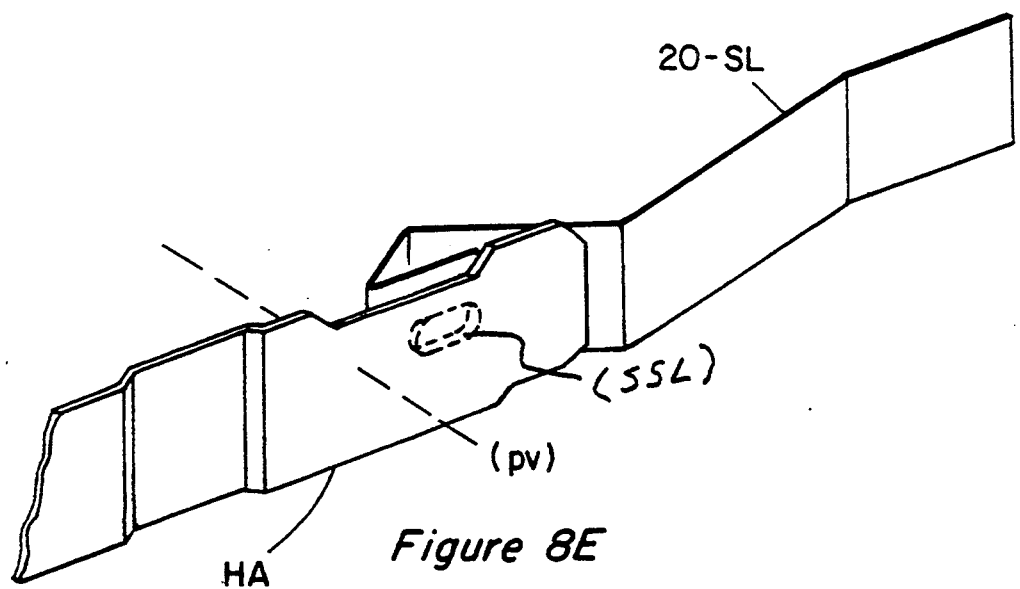
Figure 8D:
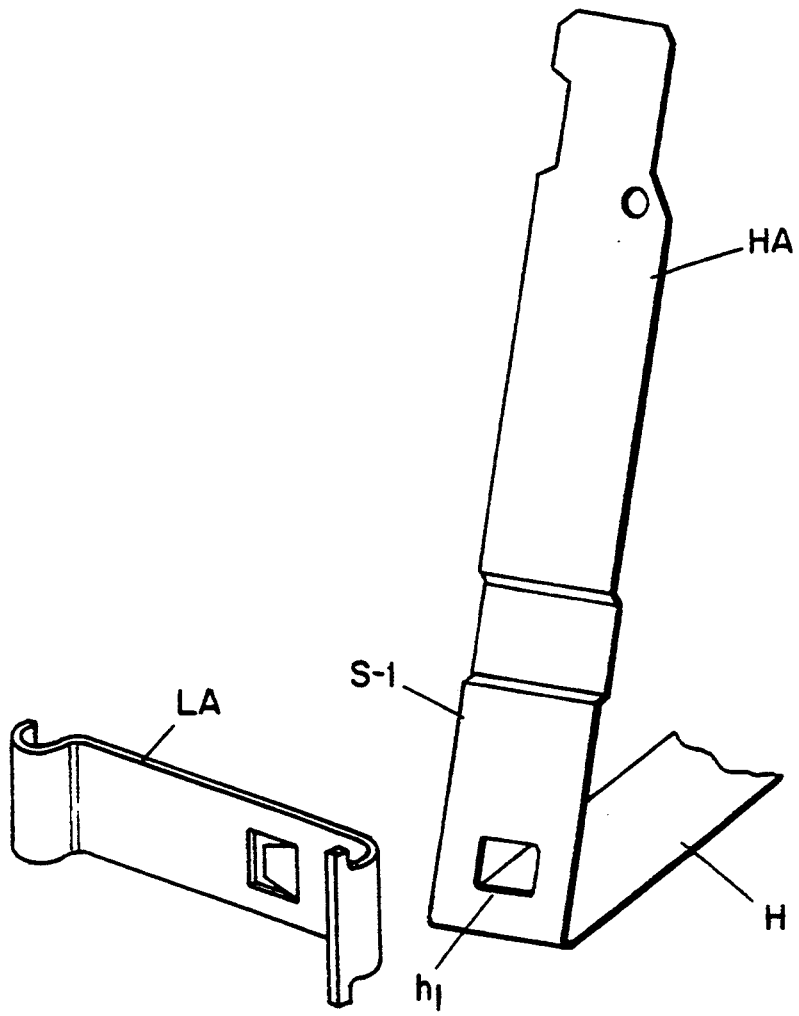
Figure 8F:
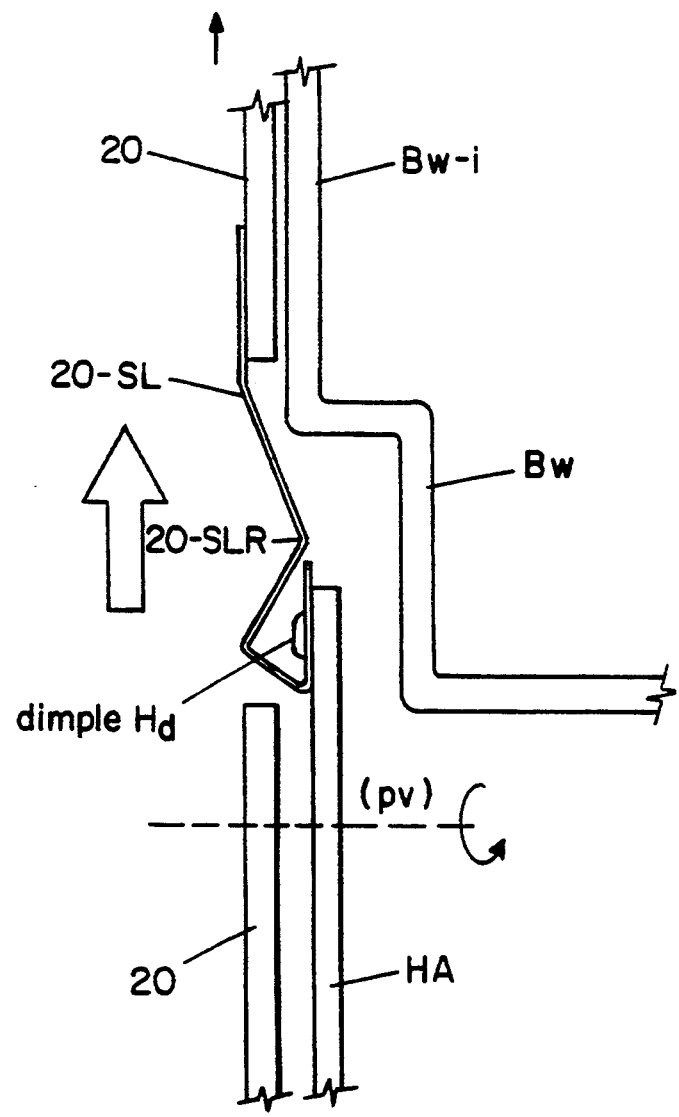

As removed from a Cabinet Bay, the handle H of a drawer 20 will be seen projected-out (as shown in FIG. 8) and held there by a "dimple" $H_d$ on the outer side of handle H (see FIGS. 8, 8E, 8F) which is seated into associated slot SSL in hold-out spring 20-SL (see FIG. 7; side of bay unseats $H_d$ as module 20 is inserted; see arrow FIG. 8F). It will be understood that a locking-assembly 20-L with arm LA (see assembly unit 20-L, FIGS. 8A, 8B, 8C) is mounted on a side of each bay to inter-act with an inserted drawer/handle etc.

FIGS. 8E, 8F give some details on the action of hold-out spring 20-SL. It will be understood that an arm portion HA of handle H (see FIG. 8) is made to present dimple $H_d$ on its outer side—adjacent which side one end of spring 20-SL is presented, with a slot SSL therein disposed and adapted to receive, and hold, dimple $H_d$ when handle H is rotated up to the horizontal position (e.g., as in FIG. 8, arm HA pivoting about pivot-point pv—a spring 20-SL being cantilevered-out from the adjacent side-wall B-W of each bay, for this; see FIGS. 8E, 8F). The bay wall is configured with an intruding portion BW-i (FIG. 8F) arranged and disposed to engage spring 20-SL (ramp 20-SLR thereof) and thrust it away from arm HA, releasing H, when module 20 is inserted sufficiently into the bay (see arrow FIG. 8F). During withdrawal of module 20, dimple $H_d$ on arm HA (FIG. 8) rides over ramp 20-SLR to reseat itself into spring slot SSL. Thus, spring 20-SL is adapted to maintain handle H horizontal when its drawer is "less-than-fully" inserted into a bay.

Drawer Insertion

Then, as module (or drawer) 20 is first directed into a (e.g., B-1 etc, FIG. 6C) the side-wall of the bay will be understood as configured to cam its spring (see 20-SL, FIG. 7), away from the dimple Ha, to release handle H and let it drop down as in FIG. 9 (and/or to be so thrust-rotated down by operator), until an outer side-edge S-3 (see FIG. 8D) of H engages lock-arm LA (i.e., tip L-h of LA, to then project a tab on LA into hole h-1 of handle H—see FIGS. 8A, 8B, 8C also).

The operator may now rotate handle H down and in to engage its side S-1 vs. the rounded tip Lh, then vs. detent dT on LA and so thrust-aside arm LA until dT is seated in slot $h_1$ of handle H (see FIGS. 8, 8C, 8D)—one may then further insert drawer 20 to engage handle H vs. a projecting stop ST (engage side edge S-1e side S-1 of H vs. dT). Rotating handle H vs. stop ST will help "pry-in" drawer 20 against the usual resistance of the many connector pins, being, the-while, seated into their receiving connector-holes.

Latch-In Action

As drawer 20 is being so pried-in (by pivoting-down of handle H) note that inner-side S-1 of handle H will soon engage the rounded tip L-h of latch-arm LA and gradually thrust it aside (see arrow, FIG. 8D), to next engage the beveled side of associated latch-tab or detent dT (projecting from arm LA e.g., see FIG. 8C), and thus further divert arm LA—with side S-1 being thrust past tab dT until it is seated and held in the receiving cutout h1 in handle H. During insertion, arm LA is constantly urged against drawer 20 by its associated spring SA, so that its tab dt will be urged into its lock-hole $h_1$ and kept there (until "unlock" action is invoked, when solenoid SoL pulls LA back).

While drawer 20 is so being locked Fully-IN (dT in $h_1$), its IN-motion will act to throw a microswitch ms which is disposed to automatically signal "Full-insertion" to the Cabinet control. (Host; see FIGS. 8A, 8C and arm ms-a with detent-tip ms-at adapted to be actuated by passage of handle H).

This rotation of handle H to pry-in drawer 20 also acts to "cock" a "push-out spring" SB (e.g., engaged by an inner side $S_3$ of H, see FIG. 8), so that, when handle H (and drawer 20) is thrust full-IN, an elongate inner side of H (e.g., $S_4$) will be aligned along an engagement-ridge R of the bay. Thus, cocked, push-out spring SB will continually counter-urge H back-out, while tab dT, in hole h, will hold H against this urging (until "unlock" mode release dT by activating solenoid SoL, so SoL thrusts tail LA-a of arm LA, e.g., as per arrows in FIG. 8C).

FIG. 9 (full-line) shows drawer 20 and handle H FULL-IN, with tab dT seated in handle-hole hi, and handle H tucked-under the frame 20-F of drawer 20, leaving a finger-grip portion H-h available for gripping when a user wishes to withdraw the module 20. The phantom-line depiction of handle H indicates "unlocked" ("ajar") condition thereof, as a signal to a user that module 20 may be withdrawn.

"Unlock"

An "unlock" signal from a control unit will cause arm LA (and tab dt) to be rotated away from handle H (see arrows, FIGS. 8B, 8C; solenoid SoL-urges tail LA-a of arm LA rotationally about pivot L-p so tab dt is thrust away from its seating-hole h1 in handle H), whereupon push-out spring SB will automatically "kick-out" handle H, urging it up and out (a few degrees—see phantom in FIG. 9) into "unlatched" (ajar) position, while also releasing microswitch ms (FIG. 8C) to automatically signal "module-withdrawn" to the control system—this ajar disposition of handle H signalling to an operator that this subject drawer 20 has been "unlocked", and may now be manually withdrawn. Workers will recognize that it can be quite useful and advantageous for such a "kick-out" arrangement to so automatically signal "module-unlocked," i.e., by so throwing the handle outward a few degrees, and ajar. [At this time two LED's are both "blinking amber"—i.e., the status LED at top of cabinet and Bay-LED next to drawer].

Preferably, this withdrawal of arm LA (and its tab dT) is effected by activation of a release-solenoid SoL, whose actuator-pin SoL-p (FIGS. 8, 8A, 8B, 8C) is thrown against arm LA (angular extension LA-a thereof), pivoting LA and dT away from module 20 to unseat dT from its hole $h_1$ (see arrow FIG. 8D). Of course, workers will recognize that other analogous means may alternatively be used to seat, and unseat, such a latch-arm and associated lock-tab.

Preferably, and for ease of installation and repair/replacement, these elements for so locking/unlocking handle H are arranged in a unitary lock-assembly 20-L mounted on each Cabinet-bay chassis via a mounting bracket (see FIGS. 6D, 8B).

Full-Withdrawal

Obviously, an operator may grasp handle H (gripping knurl portion $H_h$ thereof), once it is so unlocked and tilted-out (e.g., see FIG. 13-A) and by rotating handle H upward to "pry-out" (dislodge) its connector pins from the backplane.

Preferably (and as here-implemented), this arrangement aids this withdrawal-action, providing some mechanical advantage to help the operator—e.g., here engaging an inner, terminal side $S_4$ of handle H against a dislodgement-ridge R provided on the chassis for this purpose, so that up-rotation of H will easily pry-out drawer 20. FIGS. 13-A, 13-B, 13-C show successive stages of this withdrawal.

The controls for each such module-bay are arranged to communicate with their Cabinet via Module-In/-OUT signals (from switch ms, FIG. 8) and via an "unlock" signal (sent to activate release-solenoid SoL).

LED Status Indicators on Cabinet

The aforedescribed drawer-insertion/-removal is preferably monitored and controlled by the Cabinet CP and by the Host, with status indicators (on Cabinet master panel, and at each bay) signalling what happens, when it happens and what the user is allowed to do or prohibited from doing.

Thus, the three LED status indicators are located in the top cover (front panel) of each Cabinet 10 so a user can view them without opening the front door. Following is a description of their functions:

"Power LED": L-1, a green LED which, when lit, indicates that 5+ V power is present.

"Fault LED": L-2 a red LED which, when lit, indicates system faults.

"Cabinet-Status LED": L-3 which has four states when lit, these indicate the following Cabinet status:

Solid Green: state is asserted when Cabinet is on line and does not require any user's attention;

Blinking Amber: state is asserted to indicate permission to remove a Module 20 for storage or replacement;

Blinking Amber: state is asserted to indicate permission to insert a Module in an empty bay; and Solid Amber: is asserted to indicate "illegal insertion"; one must use "administration s/w" for "legal insertion".

"Module-Status" LED (One At Each Bay)

Each of the four MemoryModule bays has a "Module-Status LED"; it has four display states: "Disabled", "Steady Green", "Blinking Yellow" and "Blinking Amber". This LED is "Disabled" (unlit) when its Module is not installed in a module bay. When Module 20 is fully inserted in a module bay, the firmware will place its LED in one of the three other states:

"Steady Green" indicates normal operation of the Module, requiring no user attention. "Blinking Amber" indicates permission to remove the Module (e.g., for storage or replacement). "Blinking Amber" indicates permission to insert a Module.

Each Module Bay has a second dual-color LED (green/amber, visible when the front door is open), signalling the following:

"Blinking amber": Permission to remove module.

"Solid amber": Module drive has made electrical contact with backplane and can be brought online via software.

"Solid green": Module's drive has been brought on-line via software and data is now available.

"Extinguished": The module bay is unoccupied.

Both the "Cabinet-status LED" (L-3 on top cover) and a "Module-Status" LED (L-BS, behind door 11-D) blink amber when the associated Module 20 is ready to be removed. While a Module is being installed, its Module-Status LED L-BS will continue to "blink amber" until its drive has made contact with the backplane and its handle is locked-in; then it goes to "solid amber". When a Module is brought online via software, its Module-Status LED goes to "Solid Green".

Summary of Module Status, LED Conditions

Figure 11:
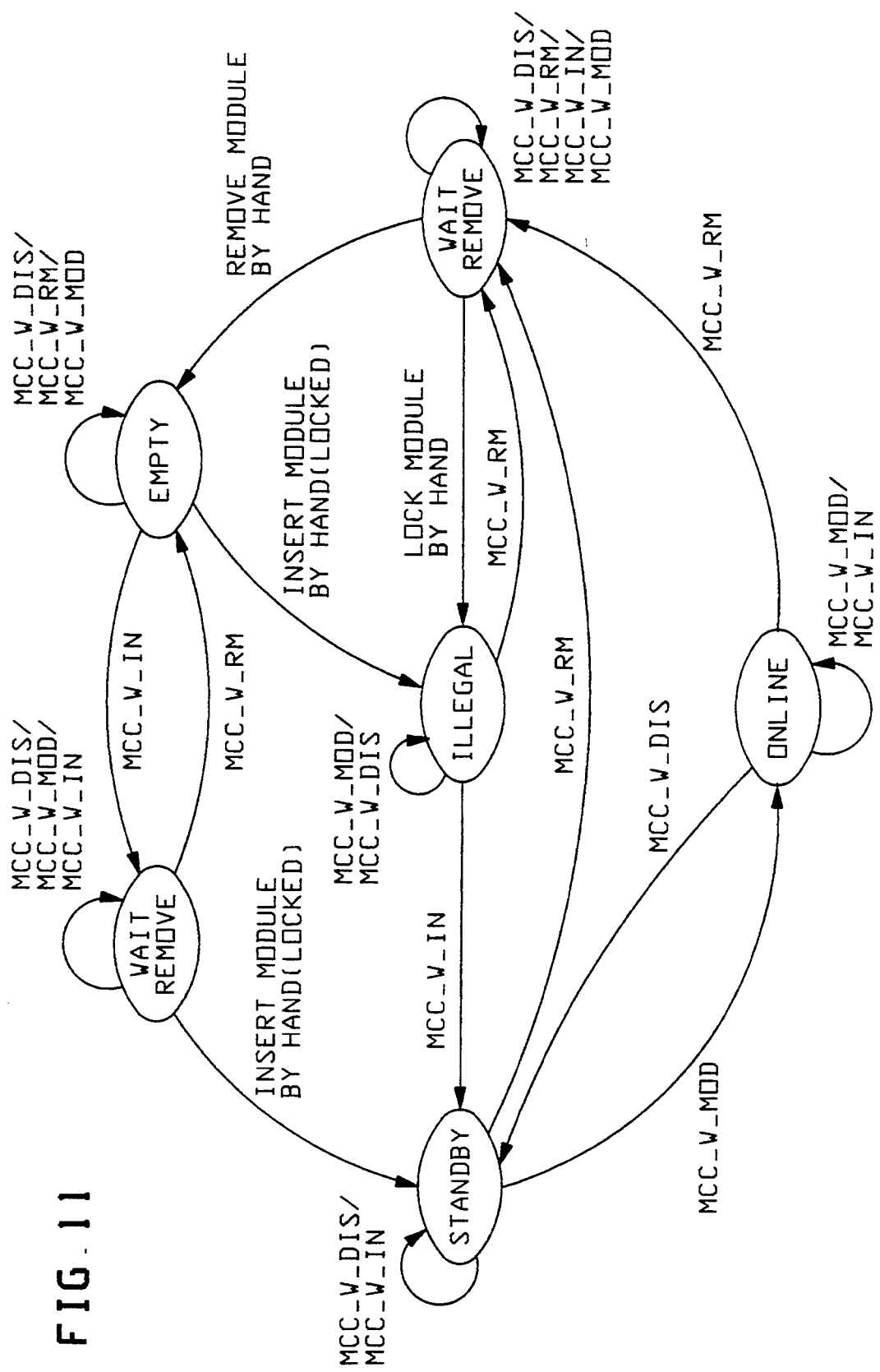

FIG. 10 tabulates and summarizes the above-indicated five LED conditions (for status LED and Module LED) as correlated with "Module Status" and related "STATE conditions". These five STATE conditions are functionally related in FIG. 11, a STATE Flow Diagram—each STATE reflecting a unique electrical/mechanical condition for a given Module 20. A STATE transition is triggered by a physical action or by a command (from Host) applied to the module.

In sum, such MemoryModules 20 (drawers) will be understood by artisans as particularly new, useful and advantageous; presenting such features as:

1. Automatic host-controlled locking/unlocking—vs. conventional manual lock, key.
2. Insertion-assist to easily plug directly into backplane—vs. usual need to attach harness, intermediate assembly.
2A. With handle giving power-assist on insert/removal.
3. Software auto-assigning drive-identity (upon power-up)—vs. need to set jumpers, throw switches manually.
4. "Hot", on-line insert/removal—vs. need to power-down.

"Hot" Insert/Removal

As aforementioned, a salient feature of the subject mass storage cabinet 10 and its memory modules 20 is "Hot insert/removal" (HIR) capability whereby the system allows a user to insert a module (drive) or remove/replace it while the Host keeps running, and without need to power-down the whole system as is conventional. The Host controls module removal/replacement via a serial port (RS-232 or RS-422) and also controls the (related) handle lock/unlock function.

The aforedescribed cabinet/multi-drawer arrangement will be seen to exhibit many advantageous features, such as:

1. Drawer Handle

Each drawer has a carrying-handle that also accommodates locking and unlocking of the drawer.

The following are useful features of the drawers:

Removable ruggedized DrawerModule, with a Disk Drive mounted in a tray suspended on compliant mounts, Carry-handle is held in horizontal carry-position via a spring catch, this catch being automatically unlocked when drawer is slid into its cabinet bay.

Once unlocked, the handle is free to pivot in a camming action with mechanical advantage easing installation/removal of the drawer when the user rotates the handle. The handle is automatically locked in place by a solenoid/latch assembly.

The drawer can be removed only by actuation of solenoid; this under software control through the Administration utilities. Once release-command is given to the solenoid, the handle is released and kicked-out (set ajar), being pushed away from the latch by two springs, one on either side of the handle;

this "ajar" condition indicates "Drawer-release".

The handle is then easily grasped by the user and rotated upward. This upward rotation cams the drawer (pries it) out and away from its connectors in the backplane.

When the handle is rotated completely to the original horizontal position, it is locked into place there by the spring catch located just behind the pivot point.

This handle thus cams its drawer in and out.

The handle locks an inserted drawer into place; solenoid assembly unlocks it under software control.

Individual drawers are thus automatically locked in place when installed.

2. Electrical Features

The backplane is comprised of two separate two-drive SCSI buses (e.g., see FIGS. 6F, 13, 16–18). These buses may be jumpered together to form one four-drive bus or be linked to other cabinets forming a seven-drive bus. This provides easy system upgrading and flexibility.

Hot insertion and removability with activity on the SCSI bus.

Figure 6F:
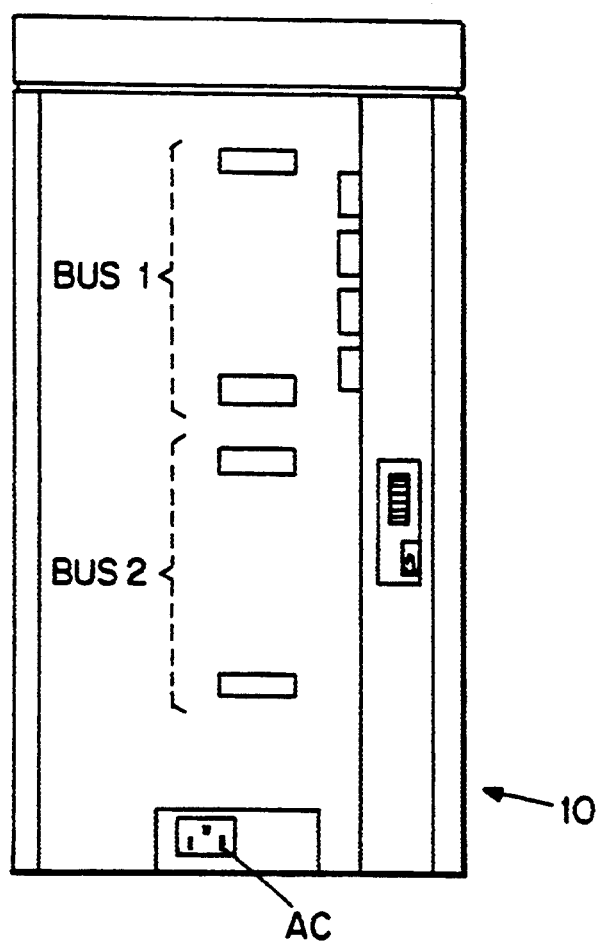
FIG. 6F is a schematic, functional depiction of elements at the rear of this cabinet.

Minimum number of switches: one thumbwheel and one dip switch (FIG. 6F).

Drawers coupled to common cabinet backplane through inexpensive connectors.

Modular power supply that interfaces directly to the backplane using "edge-card" technology.

The Host (ISIC and software) will not accept drawer-insertion unless it senses drawer-connectors pushed full-into the backplane connectors, and IN-switch closed.

Host issues "Release" signal, allowing spring to kick-out handle; switch ms verifies this.

3. Cabinet

The floor of each cabinet bay has a safety lip (B-LL, FIG. 6E) on the front edge to keep the drawer from falling down when it is removed; the lip forces one to use two hands in removing the drawer, and so makes dropping less likely.

Cabinets may be inter-coupled together to form a continuous chain of Mass Storage as needed.

4. On-Line Removal

For a user to remove a drawer (module) 20 while power is kept applied, the firmware will react to a Host command to prepare for removal. Once Host gains permission to remove module, it will send a command to the cabinet: "prepare for removal". Cabinet firmware responds by enabling the related bay- solenoid SoL to unlatch its module. The module LED and the front panel LED will be set to "Blinking Amber" state (indicates "permission to remove, or to install", a module). If the module is removed, firmware will disable the module LED and set the Front Panel LED to "Blinking Green" State. The firmware will inform the Host that module removal is complete.

Insertion

The firmware responds to a Host command for preparing On-Line Module Insertion. It sets the Front Panel LED and the Module LED to "Blinking Yellow" State and then polls the module status and acknowledges to the Host when the module has physical (electrical) connection with the backplane. After the acknowledgement, Host commands cabinet to enable the module interface and restore the front panel LED and module LED to "Steady Green" State (software has brought it on-line).

Figures 12, 12B:
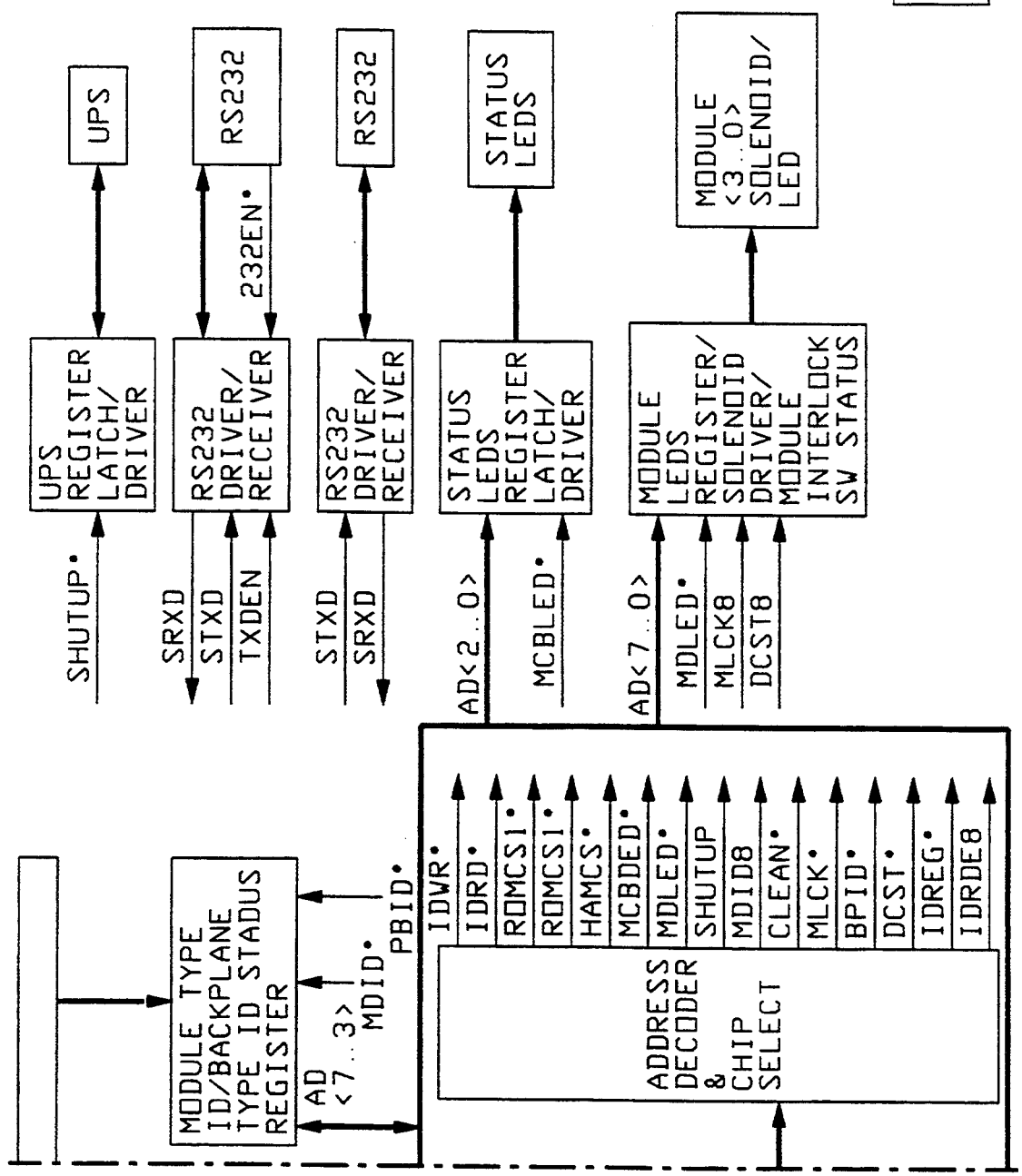
FIG. 12 is a general block diagram of a preferred I/O Controller for such a storage system, and FIG. 13 diagrams a subsection thereof.
Figure 12A:
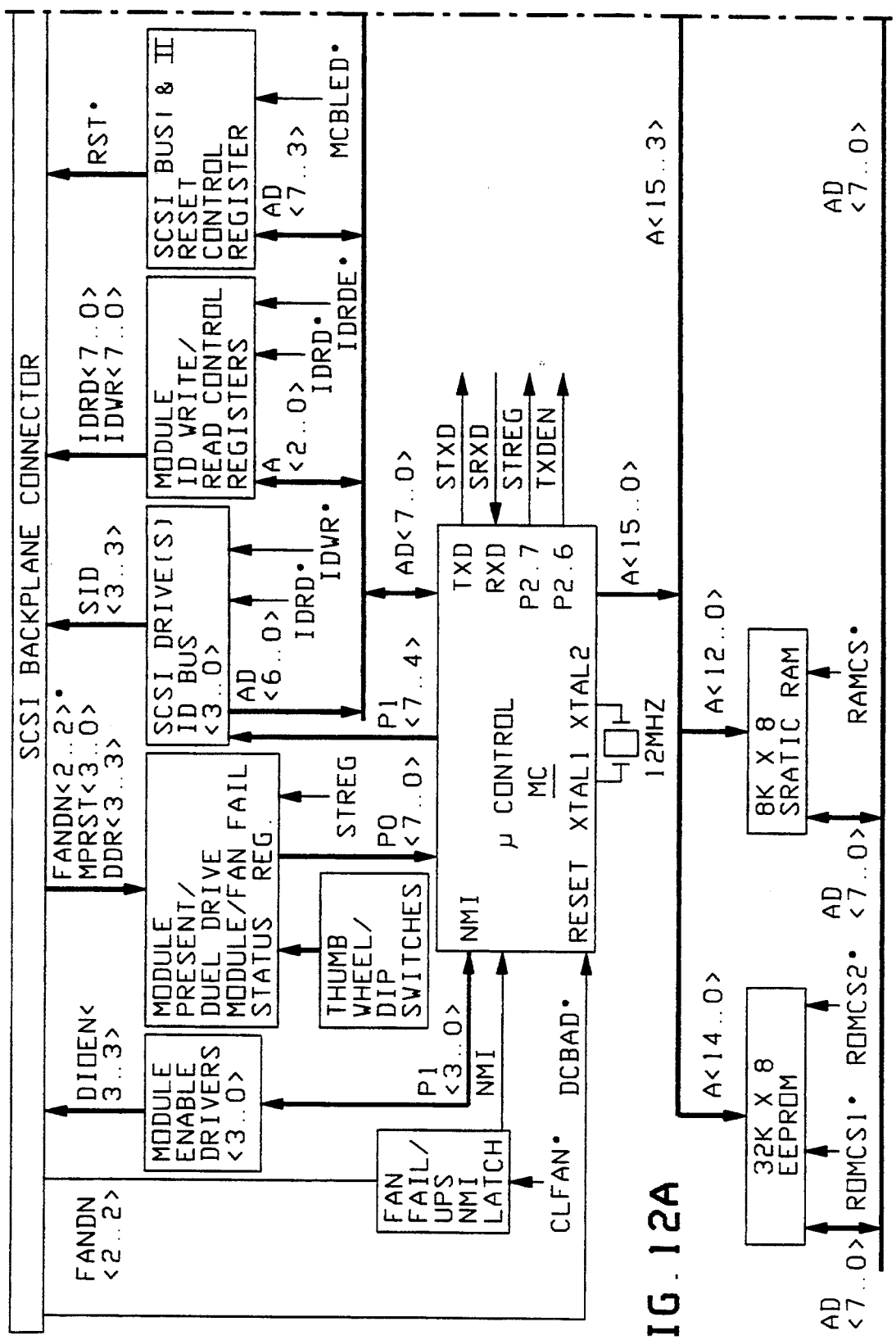

FIG. 12 is a block diagram of a preferred I/O Controller for the subject cabinet 10. An embedded microcontroller MC (e.g., Intel 80C196KB-12) is the heart of this I/O Controller, with associated firmware (preferably residing in a 32K EEPROM, as indicated, on the same I/O Controller board). The controller supports up to 64K Byte address range, with 32K thereof mapped to an external 32K EEPROM and 8K of static program memory also provided. The firmware principally serves to initialize and configure I/O Controller hardware on power boot-up and reset; it also responds to a set of commands from the Host computer and passes data and status between the Host and cabinet 10.

FIG. 13 is a simplified, generalized block diagram correlating the Host CP, the I/O Controller board I and two exemplary memory module arrays, M-1, M-2, each array including a SCSI board II, an Interface board III and one or more SCSI devices (e.g., see II$_2$, III$_2$ in M-2). FIG. 13 should be referred to in the following discussion of a preferred SCSI bus "hot insertion/removal (HIR)" design for a cabinet 10 and associated memory modules 20 like the aforedescribed.

Each cabinet 10 preferably uses the mentioned I/O board I, plus boards II, III for each memory module implement this HIR feature. The I/O Controller board I interfaces between the other boards and the host computer. Each Module interface card III is coupled between its SCSI Devices and its SCSI Backplane board II.

All three boards play a role in facilitating this HIR feature (for a given module).

The I/O Controller I will support HIR as follows:

A module 20 must be disabled before insertion and removal can be started. A signal (DIOEN) is driven from this I/O board I to disable the SCSI device interfaces III for this module. Software will enable the module device interface.

Figure 19:
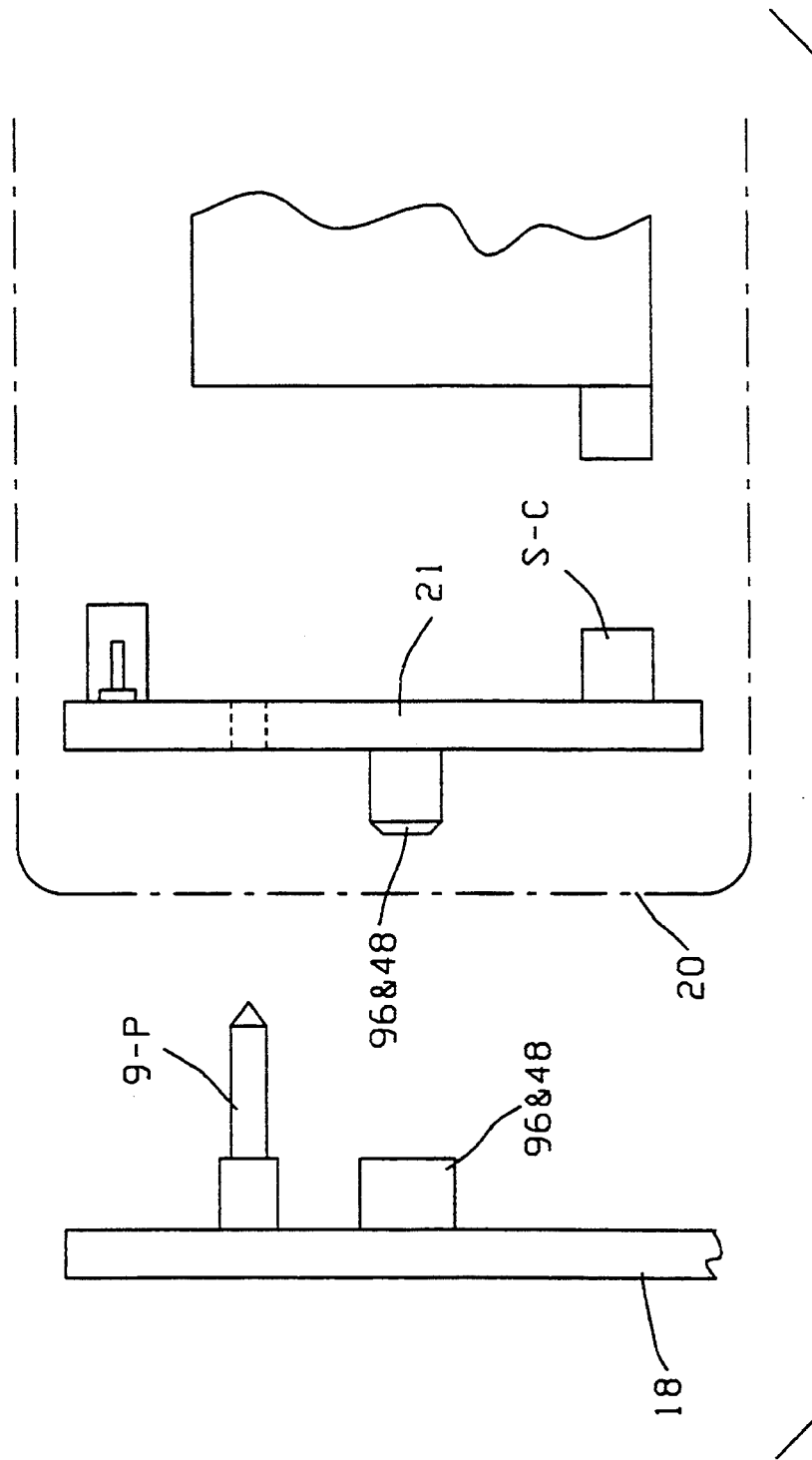
FIG. 19 is a very schematic side view of a preferred staged-length backplane-to-module connector for use with the system.

Each module's SCSI Backplane board II, will support HIR as follows:

The backplane must provide power to its module; this power is connected through a EURODIN AMPO connector with different multiple pin-lengths (e.g., as in FIG. 19). With these different pin-lengths, power application and control signals can be delayed or sequenced with another unit (connecting to a EURODIN AMP connector).

The pins preferably make contact to this Module in the following sequence:

1st: Chassis Ground—see signal S-1 in FIG. 14, a timing diagram

2nd: Logic Ground, DIOEN, and +12 PCV (+12 V to precharge the SCSI device). See FIG. 14 for Logic Ground: S-5, S-7; for DIOEN S-3 and for 10.5 V pre-charge on SCSI: S-2.

Figure 14:
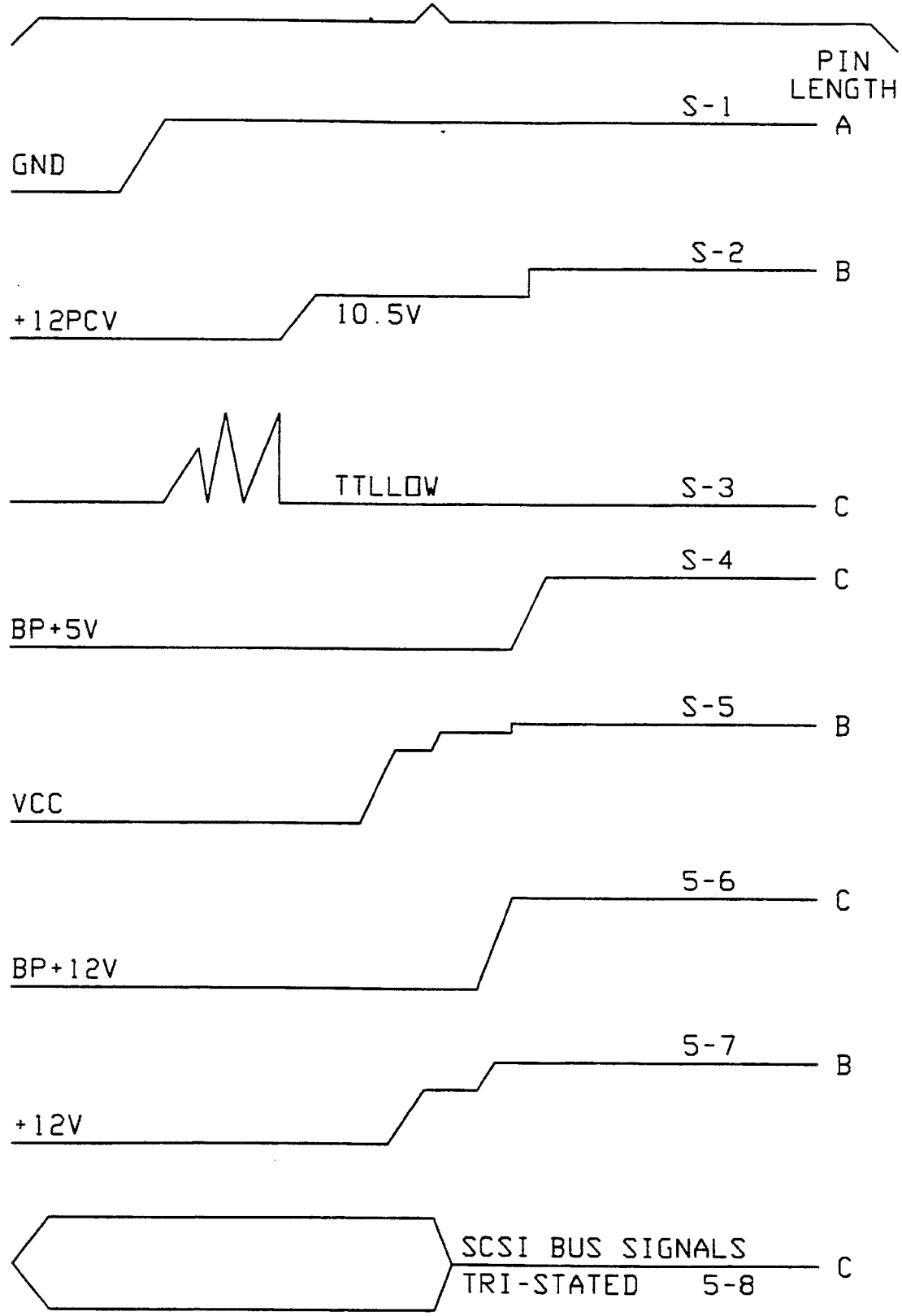
FIG. 14 is a timing diagram of signals thereof.

3rd: +12 V, +5 V to Backplane (see S-4, S-6 in FIG. 14). Module register control/status, and all SCSI BUS signals (S-8).

The copper-trace routing of the +12 V/+12 PCV/+5 V (on backplane II) are placed as discrete traces for each of four connectors, one for each Module. These signals are not bussed together from one connector to the other, but are separate, isolated traces.

In thus fashion—and as a feature hereof—a given module 20 (and drives therein) is electrically isolated from the other (three) modules in a given cabinet 10, thus reducing the risk of "propagating a glitch therebetween" across the backplane—thus, keeping such glitches local to a given module. This "module-isolation" is referenced below.

The aforementioned "sequenced pin contact" (by staged pin-lengths) is not new in itself (e.g., see U.S. Pat. No. 4,510,553 to Faultersack as used on a logic board to sequence Gnd and Power), but is new as a means of implementing such an HIR feature, or the like, in (mass) memory modules.

The Module interface card III, will support HIR as follows:

Card III will "condition" power to its SCSI device by providing a +12 V current limiter circuit (a +12 4V to 5 V down converter/current limiter).

Figure 15:
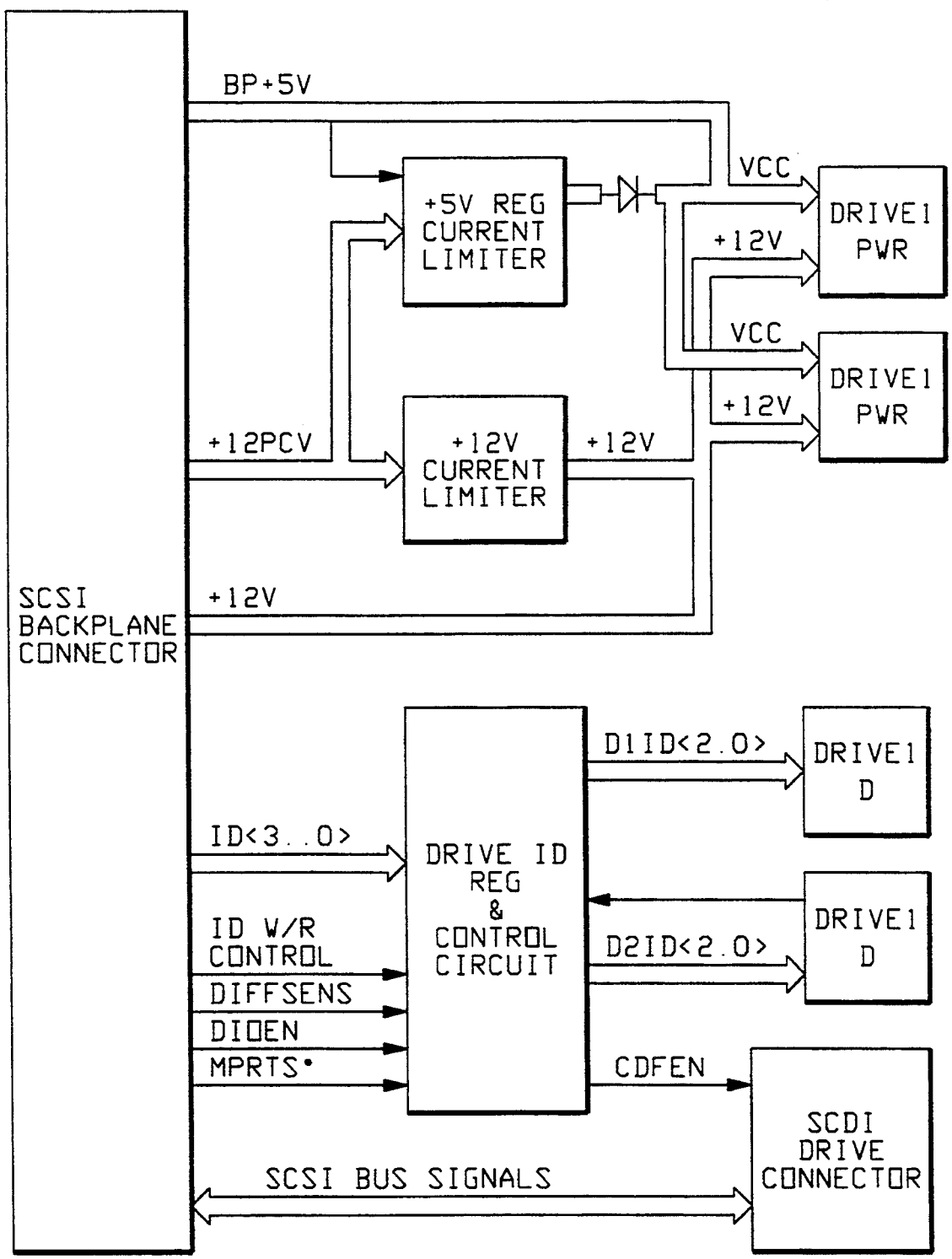
FIG. 15 is a block diagram of a preferred interface system for one such module.
Figure 17:
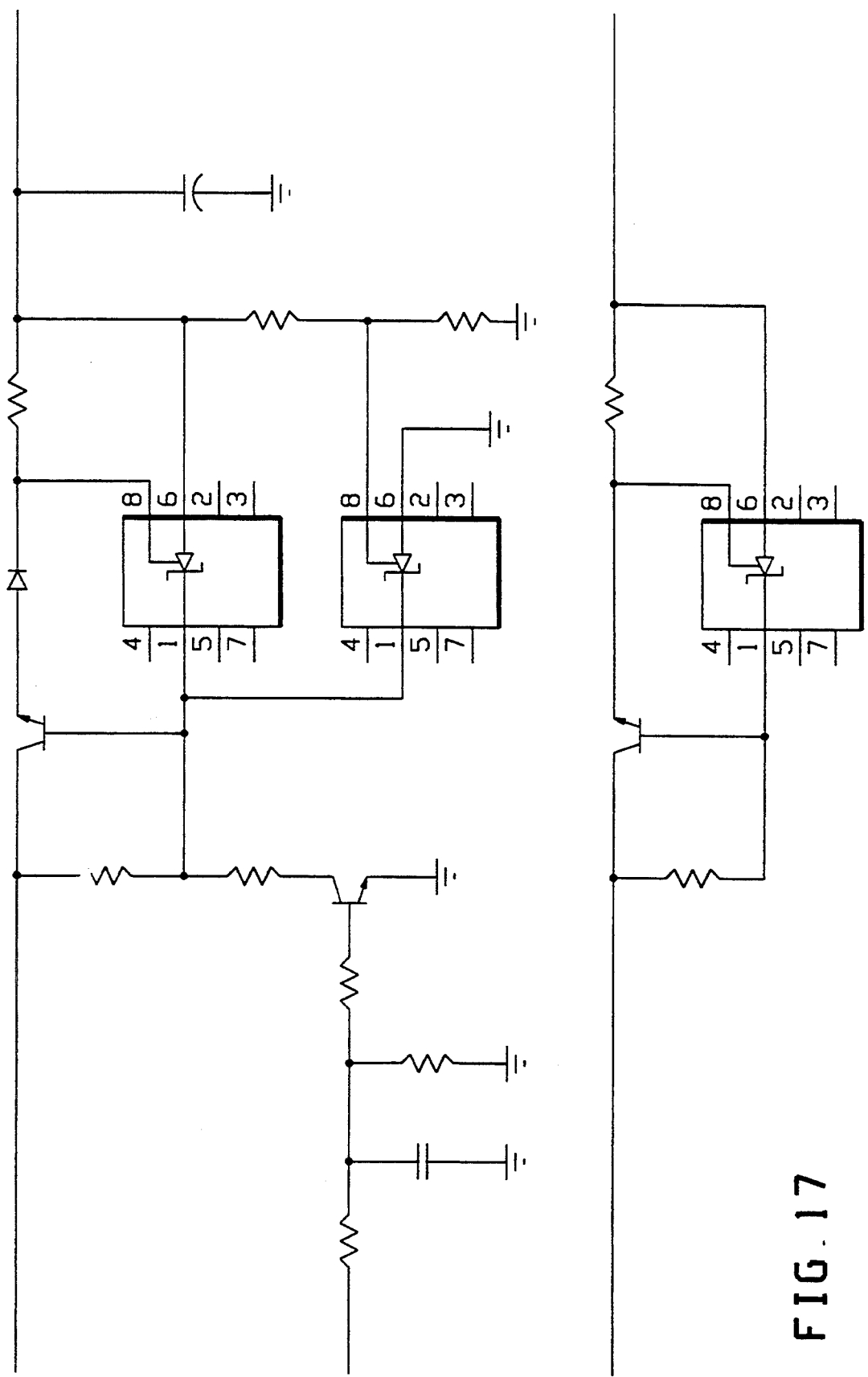
FIG. 17 is a diagram of an associated preferred current-limiter circuit.

As mentioned above, power is sequenced by the different pin-lengths on the backplane connectors. This will provide time for the power circuits on +12 V and +5 V to charge the SCSI device before the SCSI signals are connected to their SCSI bus backplane. A preferred limiter circuit is shown in FIG. 17 (+12 V current limiter, +5 V current limiter/regulator; also see FIG. 15).

The DIOEN signal from the I/O Controller is "tri-state" (i.e., can take any of three conditions); it is passed-through this card III to control its SCSI device interface signal DIFFSEN. This will disable the SCSI device from driving the SCSI bus signals.

Such "power conditioning" is novel, especially for SCSI devices like Modules 20.

Figure 16:
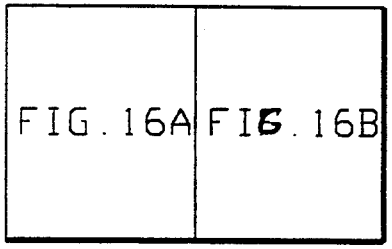
FIG. 16 is a schematic block diagram of a preferred backplane for such a cabinet.
Figure 16A:
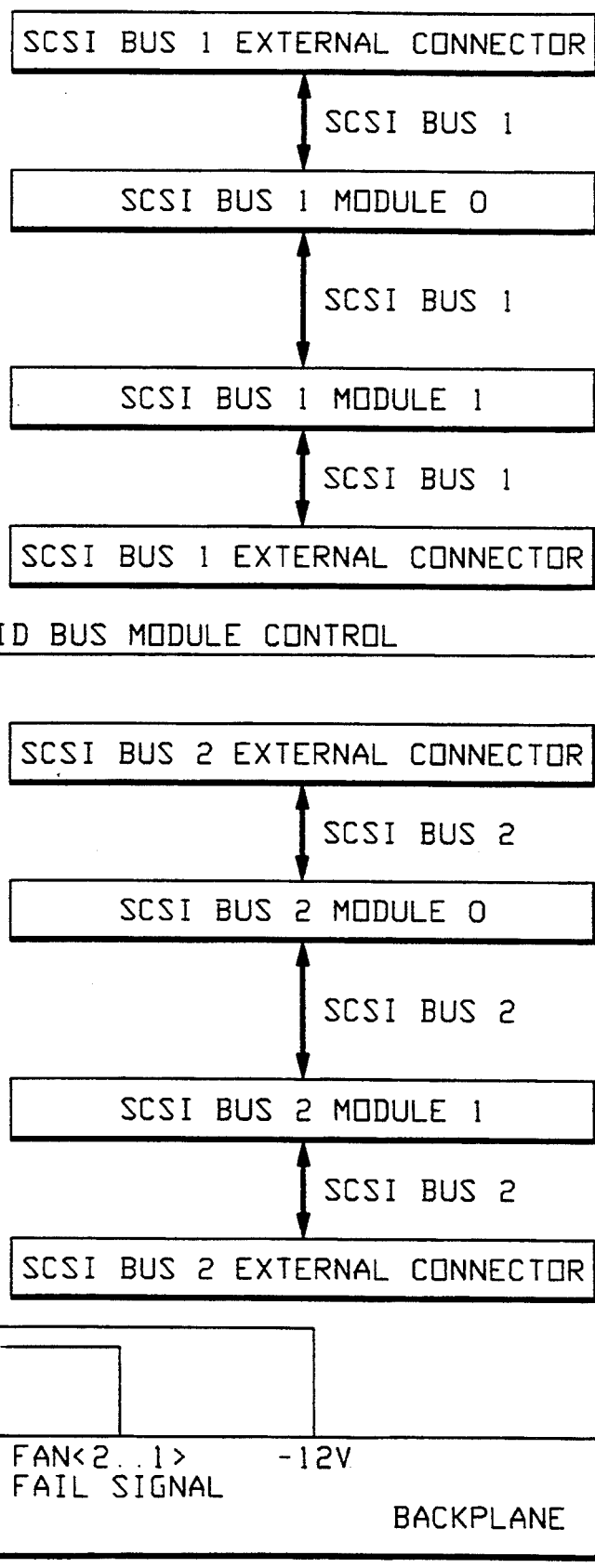
Figure 16B:
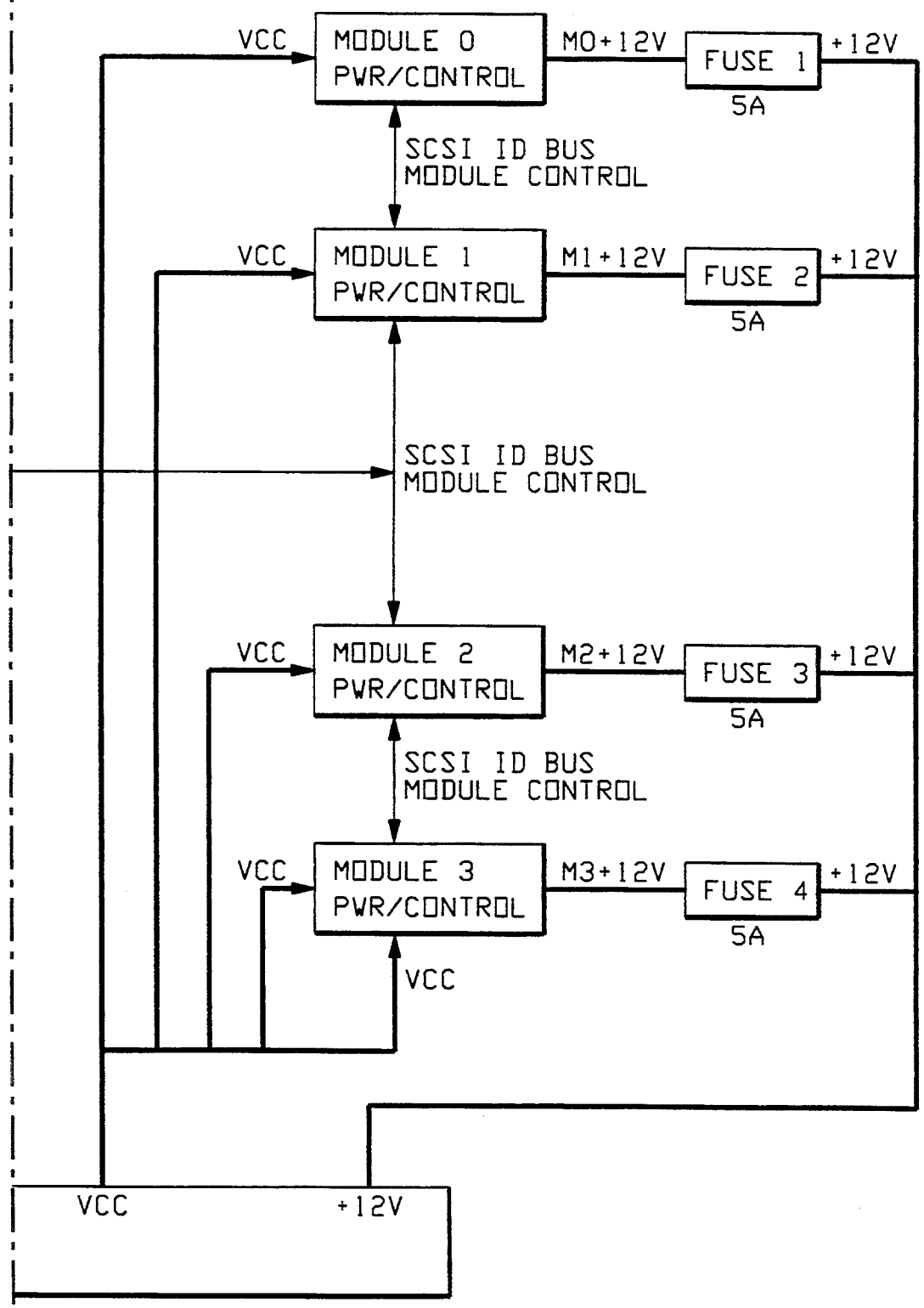

FIGS. 16 and 18 expand on FIG. 13, schematically indicating four modules (M-1, -2, -3, -4), each including a storage (e.g., disk) unit(s) and associated interface. The modules (and power supply p/s) are coupled to backplane 18, and one of two busses therein. One bus may be coupled to a first Host (ISIC #1) and the other to a second (ISIC #2; or alternatively to ISIC #1) as shown. The I/O Controller (e.g., board 17 aforedescribed; see FIG. 6-C) may be coupled to either ISIC or to a third (Host), as indicated; being coupled to backplane 18 also (e.g., via 96-pin DIN, as mentioned). As a feature of such an array; any storage unit (module) may be coupled to any HOST; and via either bus.

FIG. 19 very schematically and functionally indicates (greatly simplified and in part only) aspects of coupling a module 20 and its interface board 21 to backplane 18, with its 96/48-pin female DIN connectors—vs. 96/48-pin DIN male connectors. A guide-pin g-p is indicated on backplane 18, with receiving hole in board 21. On I/F board 21, a SCSI internal connector is indicated, as is an "address 1D" connector A-C.

FIG. 14 is a timing diagram for interface signals S-1, S-2, etc.; it reflects the signal sequence mandated by the mentioned "staged pin-lengths", with the involved connector having pin-lengths as follows: maximum-length (length A), minimum-length (length C) and intermediate-length (length B). These lengths are functionally indicated on FIG. 14, where signal S-1 is first applied via pin-length A; then signals S-2, S-5, S-7 are next applied via intermediate-length pins B, and then the other signals are applied via minimum-length pins C.

Note: to provide the mentioned "module-isolation", signals S-2, S-4, S-7 (FIG. 14) are directed separately to respective of the four memory modules (M-1 etc., FIGS. 13, 18); i.e., they are not bussed together from one module to the next; or to plural modules.

A salient feature of the above is avoidance of "latch-up", i.e., development of a low-impedance path between power conductors when a board is inserted into a "hot" (powered-up) backplane. Latch-up can burn-out CMOS devices, and can propagate voltage "glitches" to a backplane and cards plugged thereinto, etc. WE adopted the described "staged pin-lengths" to avoid this and to otherwise sequence signals optimally.

We prefer to stage pin-length to sequence pin-contact as follows:
Ground before power,
"Signals" after power,
Lower voltages before higher—as FIG. 14 illustrates (pre-engagement of the ground pin can also be arranged to also dissipate electrostatic charge from a board before any other conductors are coupled). This "staged-pin engagement" also allows one to precondition board circuitry (e.g., driving elements to a "non-transmitting condition") and thus prevent spurious signals from being propagated through backplane conductors to other boards when signal-conductors are (later) engaged (e.g., "static charges" can accumulate and, unless so dissipated, can damage components such as integrated circuit elements).

Function of Board I (FIG. 13)

To disable a module (e.g., M-1) before removal, one disables its bay before module insertion [e.g., FIGS. 13, 14, S-3 disables 1F III; software later will enable it].

Function of Board II

Power to a selected module (e.g., M-1) via EA connector, according to varied pin-length—e.g., allowing time for power circuits (+12 V, +5 V) to charge SCSI device before SCSI signals are connected to SCSI bus backplane (e.g., II), thereby sequencing (delaying) power and control signals to backplane-connectors.

Functions of Board III

1. Condition power (+12 V, +5 V) to a SCSI device via current-limiting circuit (see FIG. 17, a preferred circuit for so limiting current and down-converting).

2. The DIOEN (Tri-state) signal S-3 is passed from Board I via this Board III to control the related SCSI device 1F signal (DIFFSEN) and thereby disable the device to prevent it from driving SCSI bus signals.

Conclusion

It will be understood that the preferred embodiments described herein are only exemplary, and that the invention is capable of many modifications and variations in construction, arrangement and use without departing from the spirit of the invention. Further modifications of the invention are also possible. For example, the means and methods disclosed herein are also applicable to other pluggable, modular units, as well as to related systems. Also, the present invention is applicable for enhancing other related storage systems.

The above examples of possible variations of the present invention are merely illustrative. Accordingly, the present invention is to be considered as including all possible modifications and variations coming within the scope of the invention as defined by the appended claims.

What is claimed is:

1. An array of modular, article-receiving bays and at least one replaceable, modular push-in/pull-out article to be inserted along a prescribed axis into one of said bays; this article including carry-handle means comprising an outer bar joining a pair of arms extending along opposite sides of said article and being pivoted thereon so that the inner end of each arm is swung transverse said axis when said outer bar is rotated; each said bay having cooperating stop means disposed and adapted to engage said arm-ends to facilitate a pry-in/pry-out action therefor, said article also including "kick-out" means adapted to automatically rotate said carry-handle means about said axis, and so eject the article, at least partially, when release conditions are satisfied.

2. The array of claim 1, wherein said kick-out means comprises spring means automatically cocked simply by insertion of the article.

3. A storage array including at least two storage bay and several replaceable, modular, push-in/pull-out articles, adapted to be inserted along a prescribed axis into the receiving bay; each article including carry-handle means comprising an outer bar joining a pair of arms extending along opposite sides of said article and being pivoted thereon so that the inner end of each arm is swung transverse said axis when said outer bar is rotated; each said bay being identical and including first stop means for engaging one or both of said arm ends when they are so swung in a first direction and so helping to pry the article into a bay when so rotating said bar, and also including second stop means for engaging one or both of said arm ends when so swung opposite to said first direction and so helping pry-out the article when oppositely-rotating said bar, wherein each said carry-handle means also includes cut-out means along at least one of said arms and wherein each said bay includes resiliently, latchable latch means arranged and disposed to automatically urge a tab-portion thereof to engage said cut-out means, retainingly; said latch means also including release means adapted to withdraw said tab-portion, and thus release said handle means, responsive to a prescribed release-action.

4. The array of claim 3 wherein said release means comprises a solenoid means.

5. The array of claim 4 wherein said latch means comprises latch-arm means mounting said tab-portion and arranged to be actuated by said solenoid means to so withdraw said tab portion.

6. The array of claim 5 wherein said latch-arm means is normally resiliently urged by latch-spring means so that said tab-portion will so automatically engage said handle cut-out means, this engagement being selectively opposed by invoking said release action of said solenoid release means.

7. The array of claim 6 wherein said latch-arm means includes a first arm-length presenting said tab-portion and a transverse second arm-length for so engaging said solenoid means during release, to thereby pivot said first arm-length away from the carry-handle means.

8. A method of providing a storage array for disk drive receptacles, said array including a set of like, modular receptacle-receiving bays, control means and a set of like modular pry-in, pry-out disk drive receptacles adapted for said bays; this method comprising:
fashioning each said receptacle to include carry-handle means comprising an outer bar joining a pair of arms extending along opposite sides of said receptacle and being pivoted thereon so that the inner end of each arm is swung transversely when said outer bar is rotated; fashioning each said bay to include stop means disposed and adapted to engage said arm-ends to facilitate a pry-in/pry-out action therefor, and to also include automatic kick-out means adapted to be cocked by insertion of said receptacle and to automatically kick-out said carry-handle means when activated by said control means.

9. A method of providing a replaceable, module pry-in/pry-out article for housing components; said article to be thrust-inserted along a prescribed axis into a modular receiving bay; this method including: constructing said article to include carry-handle means comprising an outer bar joining a pair of arms extending along opposite sides of said article and being pivoted thereon so that the distal end of each arm is swung transverse said axis when said outer bar is rotated; and arranging said bay to include stop means adapted and disposed to engage the distal ends of said arms to thereby facilitate a pry-in/pry-out action for inserting/withdrawing said article in said bay this method comprising: providing anchor means in each said bay to be engaged by the arms when so rotated to thereby pry-in or pry-out the article, and also providing kick-out means adapted to automatically rotate said carry-handle means about said axis, and so eject the article, at least partially, when release conditions are satisfied.

10. The method of claim 9, wherein said kick-out means is made to comprise spring means automatically cocked simply by insertion of the article.

11. A method of providing a storage array including providing at least two modular storage bay and providing a number of replaceable, modular, pry-in/pry-out receptacles for housing components; arranging each said receptacle to be inserted along a prescribed axis into a modular receiving bay; fashioning each receptacle to include a carry-handle means comprising an outer bar joining a pair of arms extending along opposite sides of said receptacle and being pivoted thereon so that the distal end of each arm is swung transverse said axis when said outer bar is rotated; fashioning each said bay to be identical and to include stop means for engaging one or both of said distal arm ends when so swung in one direction for helping to pry the receptacle into the bay and when swung oppositely for helping pry it out of the bay, when rotating said bar one way or oppositely and also providing each said receptacle with kick-out means adapted to automatically rotate said carry-handle means about said axis, and so eject the receptacle, at least partially, when release conditions are satisfied.

12. The method of claim 11 including the step of also providing each said bay with second stop means for engaging one or both of said arm ends when swung opposite to said one direction and thus helping pry-out the receptacle when oppositely-rotating said bar.

13. The method of claim 11 including the step of also making each said carry-handle means to include cut-out means along at least one of said arms and wherein each said bay is made to include resiliently, latchable latch means arranged and disposed to automatically urge a tab-portion thereof to engage said cut-out means, retainingly; said latch means also being made to include release means adapted to withdraw said tab-portion and thus release said handle means, responsive to a prescribed release-action.

14. The method of claim 11 including the step of making said bay to also include switch means arranged and adapted to be actuated by full-insertion of said carry-handle means thereinto whereby said switch means responsively indicates FULL-IN condition of a receptacle.

15. The method of claim 11, wherein each said kick-out means is made to include spring means automatically cocked simply by insertion of the receptacle.

16. A storage array including at least two modular storage bays and a number of replaceable, modular, pry-in/pry-out receptacles for housing components; each said receptacle to be inserted along a prescribed axis into a modular receiving bay and including a carry-handle means comprising an outer bar joining a pair or arms extending along opposite sides of said receptacle and being pivoted thereon so that the inner end of each arm is swung transverse said axis when said outer bar is rotated; each said bay being identical and including stop means for engaging one or both of said arm ends when so swung oppositely for helping pry the receptacle out of the bay, when rotating said bar one way or oppositely, each said receptacle also including "kick-out" means adapted to automatically rotate said carry-handle means about said axis, and so eject the receptacle, at least partially, when release conditions are satisfied.

17. The array of claim 16, wherein each receptacle kick-out means comprises spring means automatically cocked simply by insertion of the receptacle.

18. A multi-module storage array including a set of replaceable, modular push-in/pull-out articles and at least one cabinet, each cabinet having a number of identical storage-bays for receiving any of said articles which may be inserted into any bay, each article including a carry-handle having an outer bar joining a pair of arms pivoted from opposite sides of the article so that the arm ends can be swung; each storage-bay having a first stop means adapted to engage an arm-end to pry-in the article into its bay and also having a second stop means adapted to engage an arm-end when swung oppositely to pry out the article, each said article also including kick-out means adapted to automatically rotate said carry-handle means about said axis, and so eject the article, at least partially, when release conditions are satisfied.

19. The array of claim 18, wherein each said kick-out means comprises spring means automatically cocked simply by insertion of the article.

20. A multi-module storage array including a set of replaceable, modular push-in/pull-out articles and at least one cabinet, each cabinet having a number of identical storage-bays for receiving any of said articles which may be inserted into any bay, each article including a carry-handle having an outer bar joining a pair of arms pivoted from opposite sides of the article so that the arm ends can be swung; each storage-bay having a first stop means adapted to engage an arm-end to pry-in the article into its bay and also having a second stop means adapted to engage an arm-end when swung oppositely to pry out the article; each storage-bay also including hold-spring means adapted to engage said carry-handle and maintain it in a horizontal position when the associated article is less-than-fully inserted into a bay.

21. The array of claim 20 wherein said carry-handle includes dimple means projecting toward said hold-spring means, being positioned and dimensioned to urge said hold-spring means away from said carry-handle; and where said hold-spring means includes cavity means fashioned and disposed to receive and hold said dimple means to thereby retain said carry-handle horizontal.

22. A storage array including two or more storage bay and several replaceable, modular, push-in/pull-out articles, adapted to be inserted along a prescribed axis into the receiving bay;

each article including carry-handle means comprising an outer bar joining a pair of arms extending along opposite sides of said article and being pivoted thereon so that the inner end of each arm is swung transverse said axis when outer bar is rotated;
each said carry-handle means also including cute-out means along at least one of said arms;
each bay including resiliently, latchable latch means arranged and disposed to automatically urge a tab-portion thereof to engage said cut-out means, retainingly; said latch means also including solenoid release means adapted to withdraw said tab-portion, and thus release said handle means, responsive to a prescribe release-action; said latch means comprising latch-arm means mounting said tab-portion and arranged to be actuated by said solenoid release means to so withdraw said tab portion, said latch-arm means being normally resiliently urged by latch-spring means so that said tab-portion will so automatically engage said handle cut-out means, being opposed by said release action of said solenoid release means,
each said bay being identical and including first stop means for engaging one or both of said arm ends when they are so swung in a first direction and so helping to pry the article into a bay when so rotating said bar,
and also including second stop means for engaging one or both of said arm ends when so swung opposite to said first direction and so helping pry-out the article when oppositely-rotating said bar.

23. The array of claim 22 wherein said latch-arm means is also made to include a first arm-length presenting said tab-portion and a transverse second arm-length for so engaging said solenoid means during release, to thereby pivot said first arm-length away from the carry-handle means.

24. A method of providing a storage array including at least one modular storage bay and a number of replaceable, modular, receptacles for housing components; each said receptacle to be inserted along a prescribed axis into a modular receiving bay, so as to facilitate a pry-in/pry-out manipulation of said receptacles, said method including:

making each receptacle to include carry-handle means comprising an outer bar joining a pair of arms extending along opposite sides of the said receptacle and also to include cut-out means along at least one of said arms, with the arms being pivoted thereon so that the inner end of each arm is swung transverse said axis when said outer bar is rotated;
arranging each said bay to be identical and to include stop means for engaging one or both of said arm ends when so swung in one direction for helping to pry the receptacle into the bay and to include second stop means for engaging one or both of said arm ends when swung opposite to said one direction and thus help pry-out the receptacle when oppositely-rotating said bar; and further arranging each said bay to include resiliently, latchable latch means, arranged and disposed to automatically urge a tab-portion thereof to engage said cut-out means, retainingly; while arranging said latch means to include solenoid release means adapted to withdraw said tab-portion and thus release said handle means, responsive to a prescribed release-action;
while further arranging said latch means to comprise latch-arm means mounting said tab-portion and arranged to be actuated by said solenoid release means to so withdraw said tab portion;
while also arranging said latch-arm means to be normally resiliently urged by latch-spring means so that said tab-portion will so engage said handle cut-out means, while being opposed by said release action of said solenoid means.

25. The method of claim 24 including the step of making said latch-arm means to include a first arm-length portion presenting said tab-portion and a transverse second arm-length for so engaging said solenoid means during release, to thereby pivot said first arm-length portion to unseat said tab portion away from the handle cut-out means.

26. An array of like modular, article-receiving bays; control means and at least one replaceable, modular push-in/pull-out receptacle to be inserted along a prescribed axis into any selected one of said bays; this receptacle including carry-handle means comprising an outer bar joining a pair of arms extending along opposite sides of said receptacle and being pivoted thereon so that the inner end of each arm is swung transverse said axis when said outer bar is rotated; each said bay having cooperating stop means disposed and adapted to engage said arm-ends to facilitate a pry-in/pry-out action therefor; plus automatic kick-out means adapted to be cocked by insertion of said receptacle and to automatically kick-out said carry-handle means when activated by said control means.

27. The array of claim 26 wherein said kick-cut means includes cocking spring means disposed in each said bay and adapted to be cocked when a said receptacle is inserted into the said bay and to be released by said control means when the receptacle is ready for removal.

28. A storage array including at least two storage and several replaceable, modular, push-in/pull-out articles, adapted to be inserted along a prescribed axis into the receiving bay; each article including carry-handle means comprising an outer bar joining a pair of arms extending along opposite sides of said article and being pivoted thereon so that the inner end of each arm is swung transverse said axis when said outer bar is rotated; each said bay being identical and including first stop means for engaging one or both of said arm ends when they are so swung in a first direction and so helping to pry the article into a bay when so rotating said bar, and also including second stop means for engaging one or both of said arm ends when so swung opposite to said first direction and so helping pry-out the article when oppositely-rotating said bar each said article also including "kick-out" means adapted to automatically rotate said carry-handle means about said axis, and so eject the article, at least partially, when release conditions are satisfied.

29. The array of claim 28, wherein each said bay also includes switch means arranged and adapted to be actuated by full-insertion of said carry-handle means and article into a bay, whereby said switch means responsively indicates FULL-IN condition of the article.

30. The array of claim 28, wherein said kick-out means comprises spring means automatically cocked simply by insertion of the article.

31. A multi-module storage array, comprising several identical bay means; and several identical modules adapted for insertion into any said bay means and control means; each module being electrically monitored and controlled via said control means and being adapted for selective insertion into, and withdrawal from, one of said bay means; each module also having access-handle means, said handle means including lever means for aiding in pry-in/pry-out insertion into, and withdrawal from, a selected one of said bay means; each bay means also including latch means for automatically locking-in a said module inserted therein, said latch means also being arranged and adapted to release a module, disabling its lock-in action responsive to a release-action each module also including "kick-out" means adapted to automatically rotate said carry-handle means about said axis, and so eject the module, at least partially, when the release conditions are satisfied.

32. The array of claim 31 wherein switch means is arranged and adapted to be actuated by full-insertion of a said module and handle means into the bay means, whereby said switch means responsively indicates FULL-IN condition of a module.

33. A multi-module storage array, comprising a set of identical modules, and two or more receiving bays, each module being adapted for selective insertion into, and withdrawal from, one of said bays and also having access means including lever means for aiding in pry-in/pry-out of the module during insertion into, and withdrawal from, a selected one of said bays; each bay also including pin means to accommodate said pry-in/pry-out action, and latch means for automatically locking-in a said module fully inserted therein, said latch means also being arranged and adapted to release a module, disabling its lock-in action responsive to a prescribed Release-action, each module also including kick-out means adapted to automatically rotate said carry-handle means about said axis, and so eject the module, at least partially, when release conditions are satisfied.

34. The array of claim 33, wherein each said kick-out means comprises spring means automatically cocked simply by insertion of the module.

35. A method of providing a storage array including providing at least two modular storage bays and providing a number of replaceable, modular, pry-in/pry-out receptacles for housing components; arranging each said receptacle to be inserted along a prescribed axis into a modular receiving bay; fashioning each article to include a carry-handle means comprising an outer bar joining a pair of arms extending along opposite sides of said receptacle and being pivoted thereon so that the distal end of each arm is swung transverse said axis when said outer bar is rotated; fashioning each said bay to be identical and to include stop means for engaging one or both of said distal arm ends when so swung in one direction for helping to pry the receptacle into the bay and when swung oppositely for helping pry it out of the bay, when rotating said bar one way or oppositely, and also making each said handle to include cut-out means along at least one of said arms and making each said bay to include resiliently, latchable latch means arranged and disposed to automatically urge a tab-portion thereof to engage said cut-out means, retainingly; said latch means also being made to include release means adapted to withdraw said tab-portion and thus release said handle means, responsive to a prescribed release-action.

36. The method of claim 35 including the step of making said release means to comprise a solenoid release means.

37. The method of claim 36 including the step of making said latch means to comprise latch-arm means mounting said tab-portion and arranging said tab portion to be actuated by said solenoid release means to so withdraw said tab portion.

38. The method of claim 37 including the step of making said arms to be normally resiliently urged by latch-spring means so that said tab-portion will so engage said handle cut-out means, this engagement being selectively opposed by invoking said release action of said solenoid release means.

39. The method of claim 38 including the step of making said arm means to include a first arm-length portion presenting said tab-portion and a transverse second arm-length for so engaging said solenoid release means during release, to thereby pivot said first arm-length to unseat said tab portion away from the handle cut-out means.

* * * * *